(12) United States Patent
Kim et al.

(10) Patent No.: US 7,271,408 B2
(45) Date of Patent: Sep. 18, 2007

(54) SEMICONDUCTOR DEVICE TEST PATTERNS AND RELATED METHODS FOR PRECISELY MEASURING LEAKAGE CURRENTS IN SEMICONDUCTOR CELL TRANSISTORS

(75) Inventors: Young-pil Kim, Gyeonggi-do (KR); Beom-jun Jin, Seoul (KR)

(73) Assignee: Samsung Electronics Co., Ltd. (KR)

( * ) Notice: Subject to any disclaimer, the term of this patent is extended or adjusted under 35 U.S.C. 154(b) by 122 days.

(21) Appl. No.: 10/796,672

(22) Filed: Mar. 9, 2004

(65) Prior Publication Data
US 2004/0188745 A1 Sep. 30, 2004

(30) Foreign Application Priority Data
Mar. 25, 2003 (KR) .................. 10-2003-0018588

(51) Int. Cl.
*H01L 23/58* (2006.01)
(52) U.S. Cl. .................. 257/48; 257/314; 257/E21.522
(58) Field of Classification Search .................. 257/48, 257/203, E23.015, E21.521–E21.523, 314–316; 365/201; 438/14
See application file for complete search history.

(56) References Cited
U.S. PATENT DOCUMENTS 5,625,591 A * 4/1997 Kato et al. ............. 365/185.22
6,055,655 A * 4/2000 Momohara .................. 714/723
2002/0060332 A1* 5/2002 Ikeda et al. .................. 257/298
2003/0001179 A1* 1/2003 Takeuchi ..................... 257/296

OTHER PUBLICATIONS

Young Pil Kim et al., "Reliability Degradation of High Density DRAM Cell Transistor Junction Leakage Current Induced by Band-to-Defect tunneling Under the Off-State Bias-Temperature Stress," *IEEE*, 2001.
K. Saino et al., "Impact of Gate-Induced Drain Leakage Current on the Tail Distribution of DRAM Data Retention Time," *IEEE*, 2000.

* cited by examiner

*Primary Examiner*—Kenneth Parker
*Assistant Examiner*—Matthew C. Landau
(74) *Attorney, Agent, or Firm*—Myers Bigel Sibley & Sajovec

(57) ABSTRACT

Semiconductor device test patterns are provided that include a word line on a semiconductor substrate and an active region having a first impurity doped region and a second impurity doped region in at the semiconductor substrate. A first self-aligned contact pad is electrically connected to the first impurity doped region, and a first direct contact is electrically connected to the first self-aligned contact pad. A first bit line is electrically connected to the first direct contact, and a first probing pad is electrically connected to the first bit line. The test pattern further includes a second self-aligned contact pad that is electrically connected to the second impurity doped region, and a second direct contact electrically connected to the second self-aligned contact pad. A second conductive line is electrically connected to the second direct contact, and a second probing pad is electrically connected to the second conductive line. These test patterns may be used to measure leakage current in a cell transistor of the semiconductor device.

19 Claims, 21 Drawing Sheets

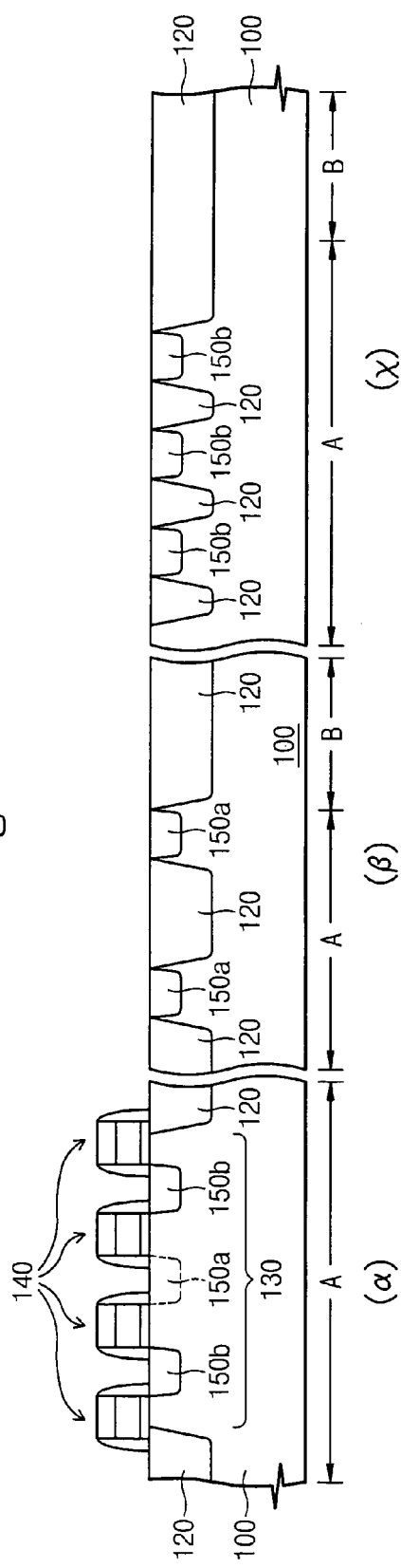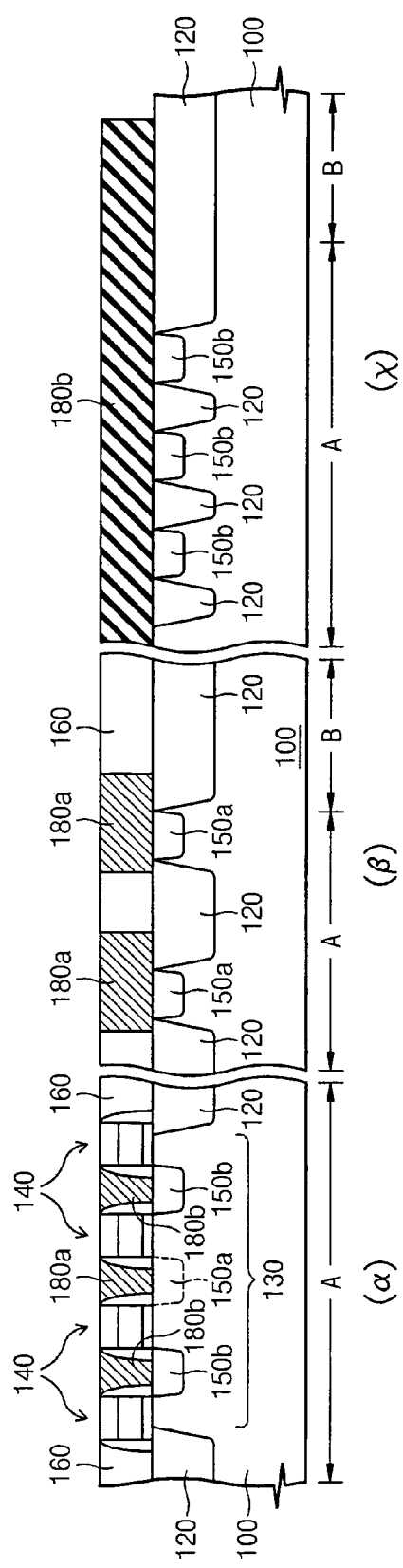

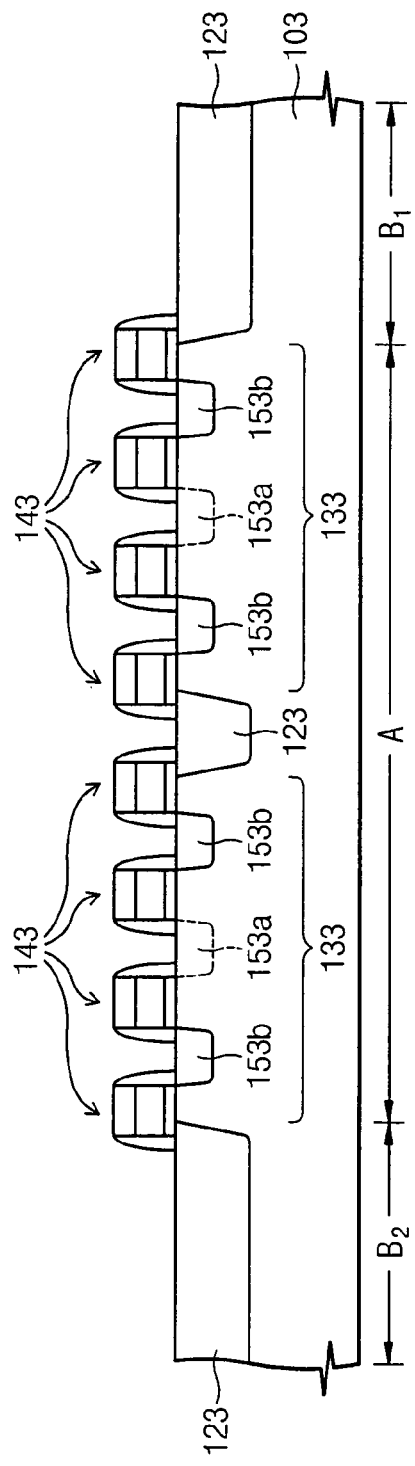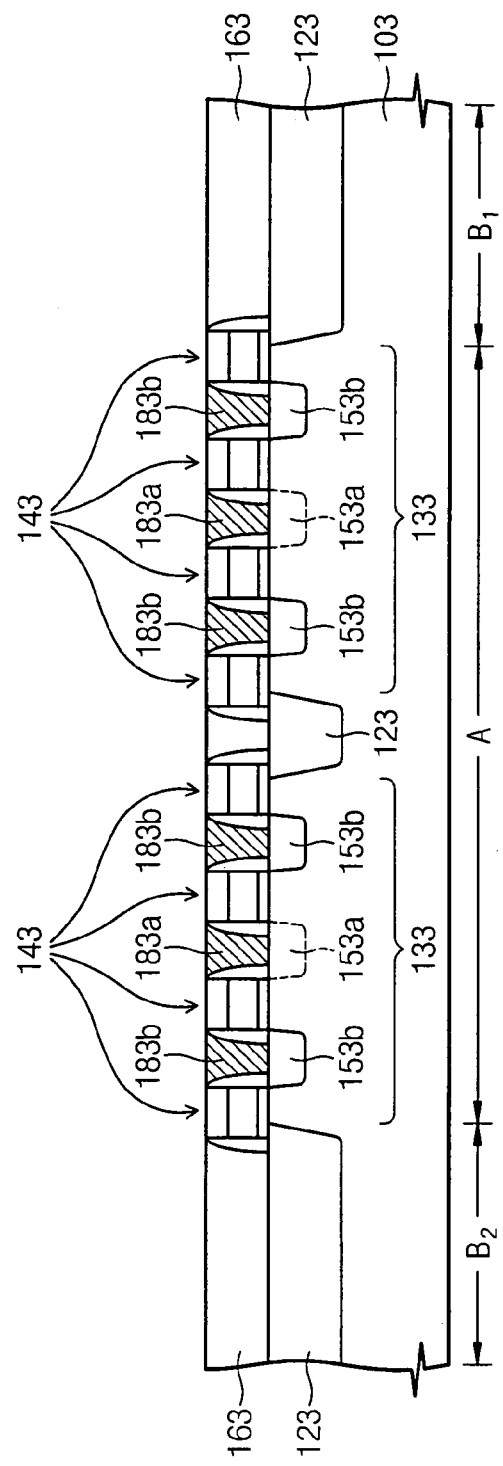

SEMICONDUCTOR DEVICE TEST PATTERNS AND RELATED METHODS FOR PRECISELY MEASURING LEAKAGE CURRENTS IN SEMICONDUCTOR CELL TRANSISTORS

CROSS REFERENCE TO RELATED APPLICATION

This application claims the priority of Korean Patent Application No. 10-2003-18588, filed on Mar. 25, 2003, which is incorporated herein in its entirety by reference.

FIELD OF THE INVENTION

The present invention relates to test patterns and, more particularly, to test patterns for measuring leakage currents in semiconductor devices and methods of manufacturing such test patterns.

BACKGROUND OF THE INVENTION

As semiconductor design and manufacturing techniques have improved over time, the degree of integration that can be achieved in semiconductor devices has increased dramatically. With this substantial increase in the degree of device integration, the size of semiconductor memory devices has been sharply reduced while simultaneously achieving significant increases in memory capacity. Generally speaking, the level of integration of a semiconductor device may be increased by reducing the dimensions of at least one, and preferably many, of its constituent parts. Capacitors are included in numerous semiconductor devices such as, for example, semiconductor memory devices. In many instances, such capacitors may have relatively high capacitance levels to, for example, improve device reliability. As such, techniques for forming small, relatively high capacitance capacitors on semiconductor substrates is of interest.

Generally speaking, the capacitance of a capacitor is proportional to the surface dimensions of the capacitor electrode and the dielectric constant of a dielectric layer, and is inversely proportional to the thickness of the dielectric layer. As such, the capacitance of a capacitor may be increased by (1) using a higher dielectric constant material as the dielectric layer, (2) decreasing the thickness of the dielectric layer and/or (3) increasing the surface dimensions of the capacitor electrode. In the last of the above-listed techniques, the surface dimensions of the electrode may be increased by using a cylindrically-shaped structure or a capacitor over bitline ("COB") structure instead of a planar structure.

As shown in FIG. 1, a COB structure includes a bit line 22 and capacitors 30 that include storage nodes 26, dielectric layers 28 and common electrode 29. The bit line 22 is formed on a semiconductor substrate 10 that includes an active region 13 which is defined by an isolation layer 12. The capacitors 30 include storage nodes 26 and dielectric layers 28, and are formed on the bit line 22 that is between insulation layers 16 and 17. The COB structure formed on the bit line 22 can increase the capacitance achieved for a given cell dimension.

As is also shown in FIG. 1, a first self-aligned contact pad 18a and a second self-aligned contact pads 18b are formed between gate structures of cell transistors 14. The first self-aligned contact pad 18a and the second self-aligned contact pad 18b may be formed, for example, of polysilicon. The first self-aligned contact pad 18a is electrically connected to a first impurity doped (source/drain) region 15a, and the second self-aligned contact pads 18b are each electrically connected to second impurity doped (source/drain) regions 15b. The first impurity doped region 15a is also electrically connected to the bit line 22, and the second impurity doped areas 15b are electrically connected to respective capacitors 30. The electrical connections may include a direct contact 20 and a buried contact 24.

Semiconductor device test patterns may be used to measure operational properties of a semiconductor device. By way of example, to measure operational properties of a cell transistor in, for example, a DRAM memory device, the bit line 22 and the storage node 26, each of which is electrically connected to respective impurity doped areas 15a/15b of the cell transistor 14, may be connected to a probing pad. To accomplish this, the bit line may itself be connected to the probing pad. However, the dielectric layer 28 that is formed on the storage node 26 is an insulation material that reduces, minimizes and/or prevents the flow of electric current. Accordingly, it can prove difficult to connect the storage node 26 to the probing pad. For example, as shown in FIGS. 1-2, a buried contact 24 may be provided that connects the storage node 26 to the impurity doped area 15b. However, in such a design bridging may occur between the buried contact 24 and the direct contact 20 which may reduce the ability to accurately measure leakage current of the cell transistor.

As shown in FIG. 3, conventionally, junction leakage current from a cell transistor and gate induced drain leakage ("GIDL") has been measured by connecting a probe to any one of the impurity doped regions area in a row of impurity doped regions. As shown in the depiction in FIG. 4 of the layout of a cell transistor array, the leakage of current may also be measured using a semiconductor device test pattern that comprises a probing pad 40 connected to a plurality of buried contacts 20 arranged in parallel rows, as disclosed in Y. P. Kim, IRPS 2001, p. 1 and K. Saino, IEDM 2000, p. 837.

SUMMARY OF THE INVENTION

Pursuant to embodiments of the present invention, semiconductor device test patterns are provided that include a word line on a semiconductor substrate and an active region having a first impurity doped region and a second impurity doped region at the semiconductor substrate. A first self-aligned contact pad is electrically connected to the first impurity doped region, and a first direct contact is electrically connected to the first self-aligned contact pad. A first bit line is electrically connected to the first direct contact, and a first probing pad is electrically connected to the first bit line. The test pattern further includes a second self-aligned contact pad that is electrically connected to the second impurity doped region, and a second direct contact electrically connected to the second self-aligned contact pad. A second conductive line is electrically connected to the second direct contact, and a second probing pad is electrically connected to the second conductive line. The test pattern may further include a first metal contact between the first bit line and the first probing pad that electrically connects the first bit line and the first probing pad and a second metal contact between the second conductive line and the second probing pad that electrically connects the second conductive line and the second probing pad.

In embodiments of the present invention, the first self-aligned contact pad is one of a plurality of discrete first self-aligned contact pads that are disposed between the word line and a second word line. In such embodiments, the test pattern may further include an insulating pattern disposed between each of the first self-aligned contact pads. In other embodiments of the present invention, the second self-aligned contact pad extends in a continuous line between the word line and the second word line to electrically connect to a plurality of second impurity doped regions that are disposed between the word line and a second word line.

In certain embodiments of the present invention, the first bit line is perpendicular to a major axis of the active region. The second conductive line may be either a second bit line or a probing line and may be either perpendicular or parallel to the word line. In certain embodiments of the present invention, the major axis of the active region is at an oblique angle with respect to the word line.

The second contact may be a direct contact or a buried contact. The first bit line and/or the second conductive line may have a plurality of arms, and one of the arms of the first bit line may be disposed between each adjacent set of arms of the second conductive line. The second self-aligned contact pad may be one of a plurality of discrete second self-aligned contact pads that are disposed between the word line and a second word line, and the second impurity doped region may be one of a plurality of discrete second impurity doped regions that are likewise disposed between the word line and the second word line. In such embodiments, each of the second self aligned contact pads may electrically connect to two of the discrete second impurity doped regions.

Pursuant to further embodiments of the present invention, methods of forming a semiconductor device test pattern are provided. In these methods, a word line and first and second impurity doped regions are formed on a semiconductor substrate. A first self-aligned contact pad is formed that electrically connects to the first impurity doped region and a second self-aligned contact pad is formed that electrically connects to the second impurity doped region. A first direct contact is formed that electrically connects to the first self-aligned contact pad, and a second contact is formed that electrically connects to the second self-aligned contact pad. A first bit line is formed that electrically connects to the first direct contact, and a second conductive line is formed that electrically connects to the second contact. A first metal contact is formed that is electrically connected to the first bit line and a second metal contact is formed that is electrically connected to the second conductive line. A first probing pad is formed that electrically connects to the first metal contact, and a second probing pad is formed that electrically connects to the second metal contact.

In certain embodiments of the present invention, the methods may further include forming a first interlayer dielectric layer on the semiconductor substrate, forming a second interlayer dielectric layer on the first interlayer dielectric layer, and forming a third interlayer dielectric layer on the second interlayer dielectric layer. In such embodiments, the first self-aligned contact pad may penetrate the first interlayer dielectric layer to electrically connect to the first impurity doped region and the second self-aligned contact pad may penetrate the first interlayer dielectric layer to electrically connect to the second impurity doped region. The first direct contact may penetrate the second interlayer dielectric layer to electrically connect to the first self-aligned contact pad and the second direct contact may penetrate the second interlayer dielectric layer to electrically connect to the second self-aligned contact pad. The first metal contact may penetrate the third interlayer dielectric layer to electrically connect to the first bit line, and the second metal contact may penetrate the third interlayer dielectric layer to electrically connect to the second conductive line. In certain embodiments, the second direct contact may further penetrate the third interlayer dielectric layer so that the second contact is a buried contact. In such embodiments, a fourth interlayer dielectric layer may be formed on the third interlayer dielectric layer, and the first metal contact may penetrate both the fourth and third interlayer dielectric layers to electrically connect to the first bit line and the second metal contact penetrates the fourth interlayer dielectric layer to electrically connect to the second conductive line.

In still further embodiments of the present invention, methods of measuring leakage current between a first impurity doped region and a second impurity doped region of a cell transistor in a semiconductor device are provided. Pursuant to these methods, a first probing pad is electrically connected to the first impurity doped region through a first contact pad and a first bit line, and a second probing pad is electrically connected to the second impurity doped region via a second contact pad and a second conductive line. The leakage current of the cell transistor may then be measured by measuring the current flowing between the first probing pad and the second probing pad. A first direct contact may further be included in the electrical path between the first probing pad and the first impurity doped region, and a second contact may likewise further be included in the electrical path between the second probing pad and the second impurity doped region.

In certain embodiments of the present invention, the second conductive line is a second bit line, and the second contact pad electrically connects to a plurality of impurity doped regions associated with a plurality of other cell transistors of the semiconductor device. In other embodiments, the second contact comprises a buried contact, and the second conductive line comprises a probing line that electrically connects to a plurality of buried contacts associated with a plurality of other cell transistors of the semiconductor device. In still other embodiments, the first bit line and the second conductive line may each form an oblique angle with respect to an active region defined by the first impurity doped region and the second impurity doped region. In such embodiments, the second contact pad further electrically connects to an impurity region associated a second cell transistor of the semiconductor device.

BRIEF DESCRIPTION OF THE DRAWINGS

FIGS. 10-14 are cross-sectional views that illustrate methods for fabricating the semiconductor device test pattern of FIG. 5.

FIGS. 18-22 are cross-sectional views that illustrate methods for fabricating the semiconductor device test pattern of FIG. 15.

DETAILED DESCRIPTION

Figure 1:
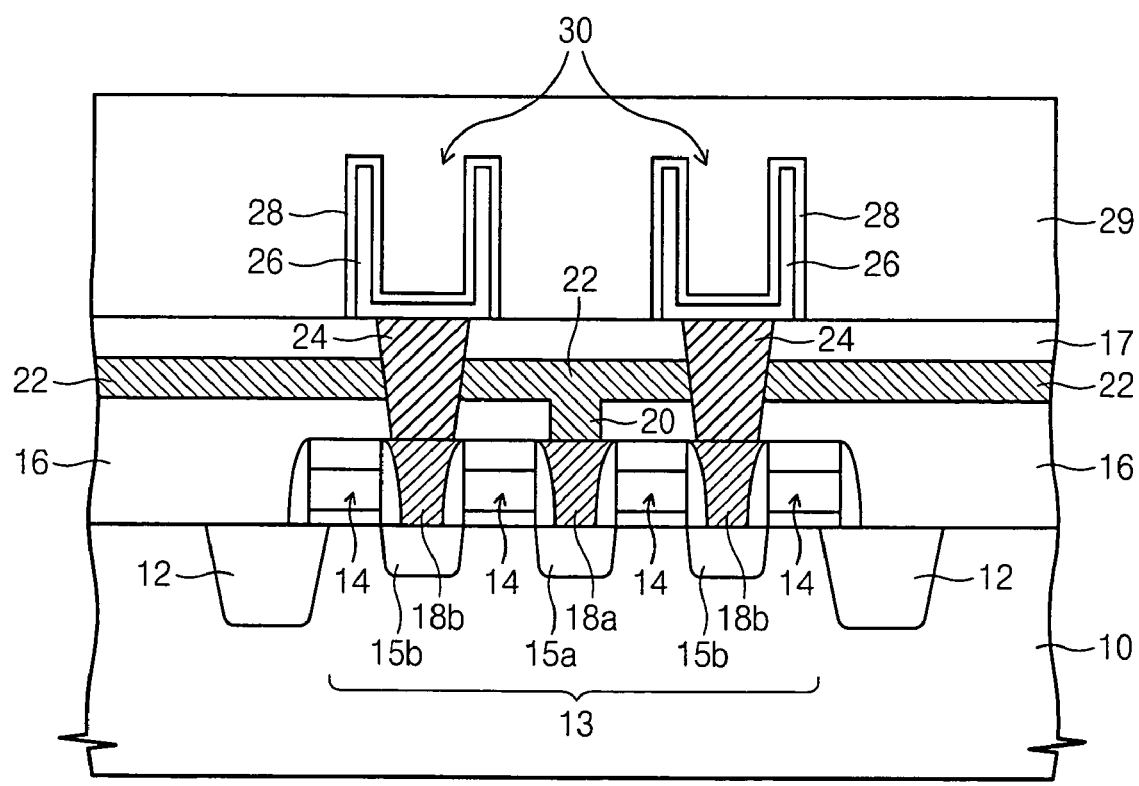
FIG. 1 is a cross-sectional view of a prior art semiconductor device that includes a capacitor-over-bitline structure.
Figure 2:
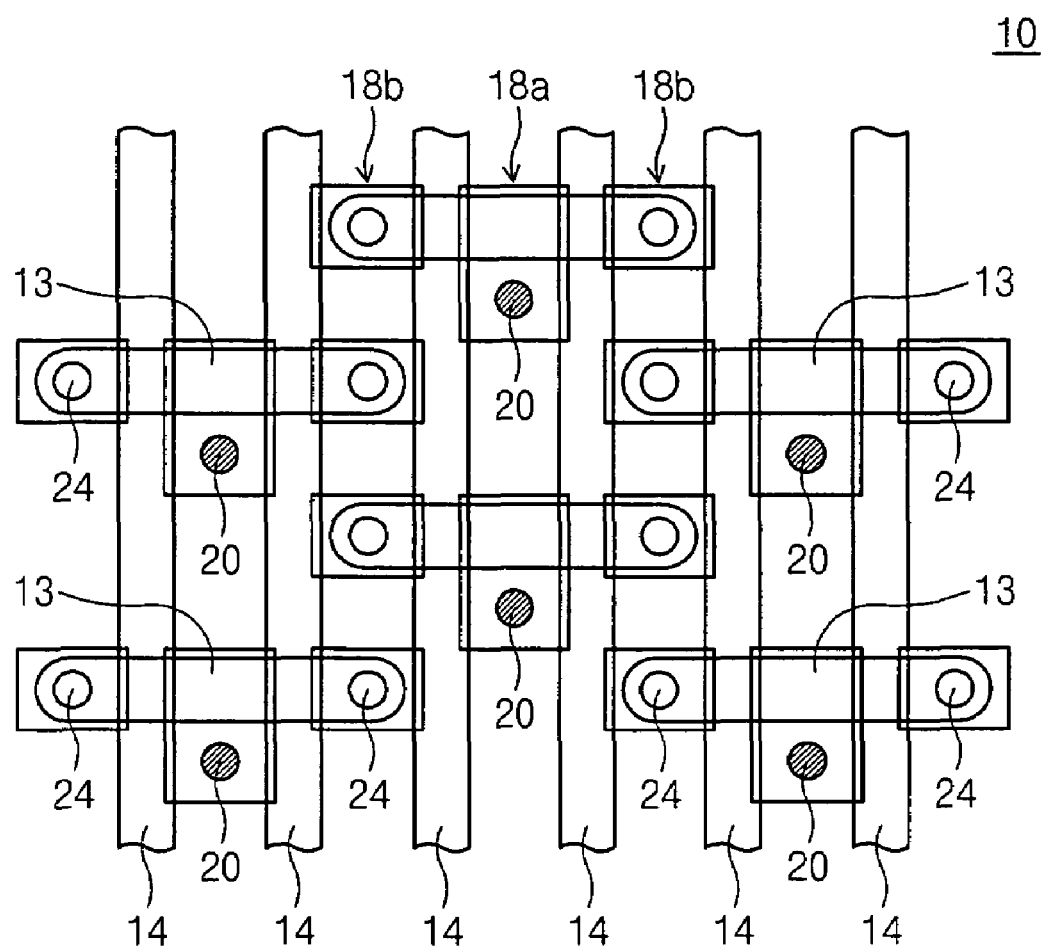
FIG. 2 is a top view of a prior art semiconductor device test pattern.
Figure 3:
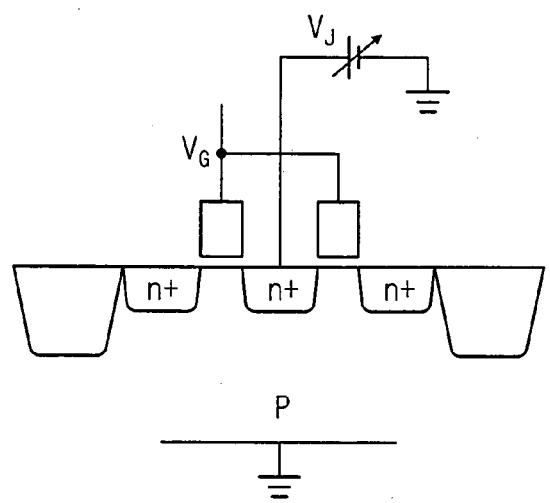
FIG. 3 is a schematic diagram illustrating a prior art technique for measuring the junction leakage current in a semiconductor device.
Figure 4:
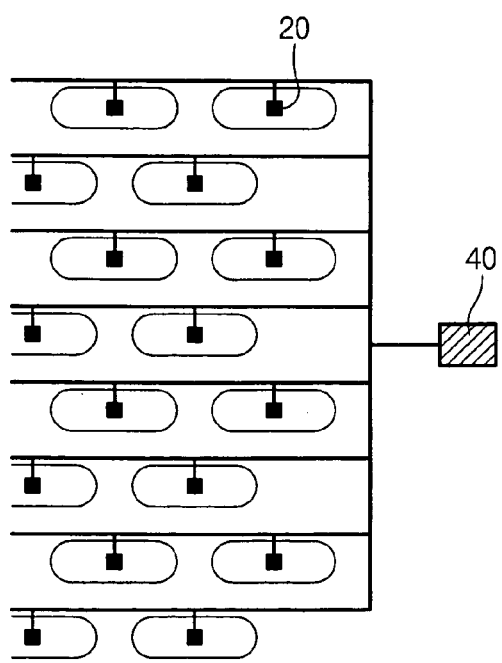
FIG. 4 is a schematic diagram of a prior art cell transistor array test pattern.

The present invention will now be described more fully with reference to the accompanying drawings, in which exemplary embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. It will also be understood that when a layer or element is referred to as being "on" another layer, element or substrate, it can be directly on the other layer, element or substrate, or intervening layers and/or elements may also be present. In contrast, when a layer/element is referred to as being "directly on" another layer/element/substrate, there are no intervening layers or elements present. Likewise, when an element/layer is described as being "between" two other elements/layers it may be the only element between the two other elements/layers or additional elements/layers may also be present. Like reference numerals refer to like elements throughout.

Figure 5:
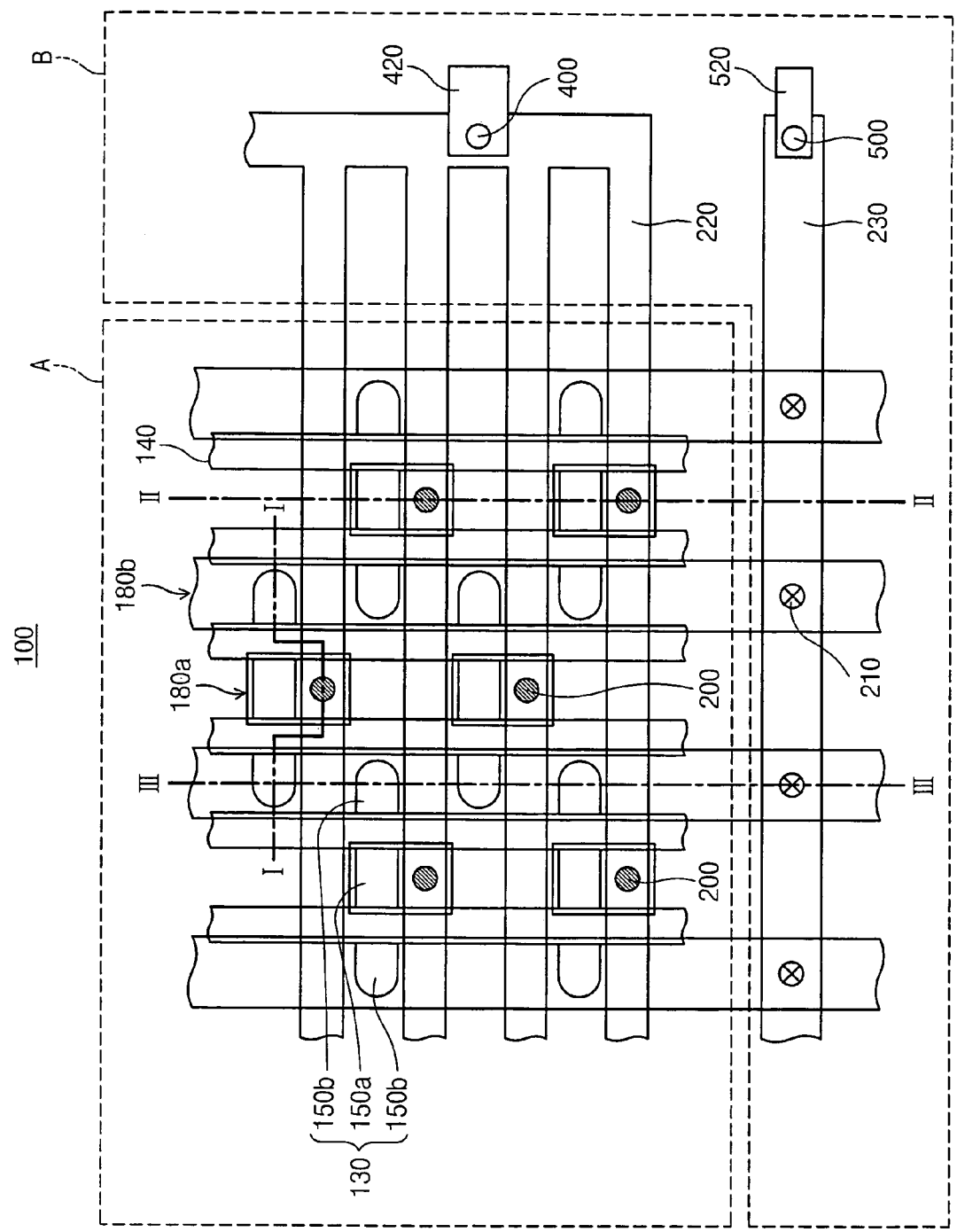
FIG. 5 is a top view of a semiconductor device test pattern according to first embodiments of the present invention.

FIG. 5 is a top view of a semiconductor device test pattern according to firsts embodiment of the present invention. The semiconductor device test pattern may be formed on a semiconductor substrate such as a silicon substrate 100. As shown in FIG. 5, a plurality of elongated word lines 140 (providing common gate structures for pluralities of memory cell transistors) are arranged parallel to each other on the semiconductor substrate 100. In the embodiment depicted in FIG. 5, the word lines 140 are arranged in the vertical direction, although it will be appreciated that other orientations may also be used.

As is further shown in FIG. 5, a first elongated bit line 220 is electrically connected to a first probing pad 420 through a first metal contact 400. This connection is located in an outer region B of the cell array. The first bit line 220 is arranged at a right angle to the word lines 140. A second bit line 230 is electrically connected to a second probing pad 520 through a second metal contact 500. This connection is also located in the outer region B of the cell array. The second bit line 230 is likewise arranged at a right angle to the word lines 140.

The cell array includes a plurality of active regions 130. Each active region may include a first impurity doped region 150a and second impurity doped regions 150b that are formed at the semiconductor substrate 100. The major axis of the active regions 130 may be disposed at right angles to the word lines 140. The first impurity doped regions 150a and the second impurity doped regions 150b may be doped with impurities such as phosphorous or boron. The first impurity doped regions 150a are electrically connected to the first bit line 220, and the second impurity doped regions 150b are electrically connected to the second bit line 230, as follows.

As shown in FIG. 5, the first bit line 220 is electrically connected through first self-aligned contact pads 180a and first direct contacts 200 to the first impurity regions 150a. The first self-aligned contact pads 180a are connected to respective first impurity doped regions 150a. The first self-aligned contact pads 180a are aligned between adjacent word lines 140 and are separated by a plurality of isolation regions. The first self-aligned contact pads 180a may, for example, be formed using a conductive material such as impurity doped polysilicon so that it operates as a conductor. The first self-aligned contact pads 180a are electrically connected through the first direct contacts 200 to the first bit line 220.

The second bit line 230 is electrically connected through second self-aligned contact pads 180b and second direct contacts 210 to the second impurity doped regions 150b. The second self-aligned contact pads 180b are electrically connected to the second impurity doped regions 150b and formed between the word lines 140. The second self-aligned contact pad 180b may, like the first self-aligned contact pad 180a, be formed of polysilicon.

As is also shown in FIG. 5, the second self-aligned contact pads 180b may be elongated such that they are arranged in parallel with the word lines 140. The second self-aligned contact pads 180b may extend across the entire cell array region A and into the outer region B. The second self-aligned contact pads 180b may be electrically connected, through the direct contact 210, to the second bit line 230 in the outer region B.

Figure 6:
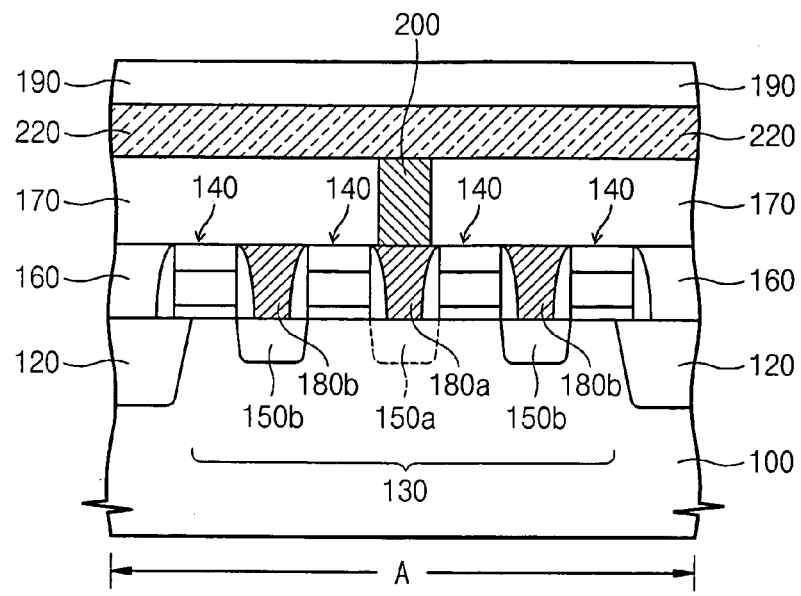
FIG. 6 is a cross-sectional view of the test pattern of FIG. 5 taken along the line I-I in FIG. 5.

FIG. 6 is a cross-sectional view, as taken I-I in FIG. 5. As shown in FIG. 6, semiconductor device test patterns according to first embodiments of the present invention may include a plurality of the word lines 140 that are formed on the semiconductor substrate 100. A plurality of active regions 130 are defined at the semiconductor substrate 100 by an isolation layer 120. The first self-aligned contact pad 180a and the second self-aligned contact pads 180b are formed between the word lines 140.

The active region 130 includes the first impurity doped region 150a (the first impurity doped region 150a is omitted from FIG. 6, but is depicted by a dotted line to show the present invention clearly and definitely) and the second impurity doped regions 150b, each of which may be formed in the semiconductor substrate 100 between the word lines 140. The first impurity doped region 150a is electrically connected to the first self-aligned contact pad 180a, and the second impurity doped region 150b is electrically connected to the second self-aligned contact pad 180b. The first self-aligned contact pad 180a is electrically connected through the first direct contact 200 to the first bit line 220.

The device further includes first, second and third interlayer dielectric layers labeled 160, 170, 190, respectively. The first, second and third interlayer dielectric layers 160, 170, 190 electrically insulate various components formed on the semiconductor substrate 100.

Figure 7:
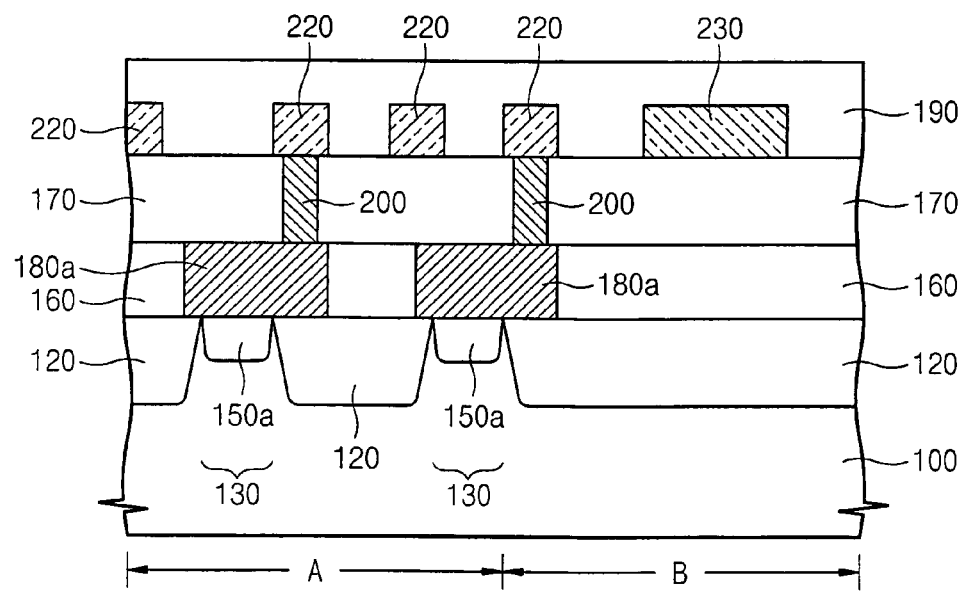
FIG. 7 is a cross-sectional view of the test pattern of FIG. 5 taken along the line II-II in FIG. 5.

FIG. 7 is a cross-sectional view taken along the line II-II in FIG. 5. As shown in FIGS. 5 and 7, the first self-aligned contact pads 180a are discontinuous (i.e., they do not completely traverse the cell array region A, but instead are formed in distinct, discrete areas on respective impurity doped regions 150a). The first self-aligned contact pads 180a are electrically connected through the first direct contacts 200 to the first bit line 220. The second bit line 230 is formed in the outer region B.

Each active region 130 includes a first impurity doped region 150a that is formed on the semiconductor substrate 100. As shown in FIG. 7, the first impurity doped regions 150a are electrically connected to a respective first self-aligned contact pad 180a.

Figure 8:
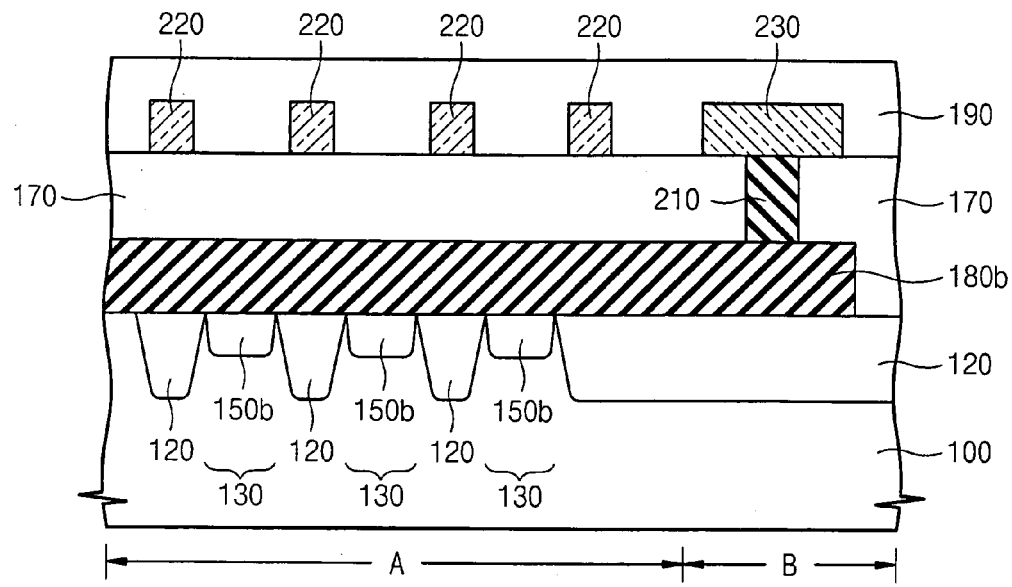
FIG. 8 is a cross-sectional view of the test pattern of FIG. 5 taken along the line III-III in FIG. 5.

FIG. 8 is a cross-sectional view, taken along the line III-III in FIG. 5. As shown in FIG. 8, the second self-aligned contact pad 180b is formed on the semiconductor substrate 100, on the active regions 130, and the isolation layer 120. The second self-aligned contact pad 180b is electrically connected to a plurality of the second impurity doped regions 150b that are formed in the semiconductor substrate 100. The second self-aligned contact pad 180b may have a linear shape and may extend through both the cell array region A and the outer region B. The second self-aligned contact pad 180b is electrically connected, through the second direct contact 210, to the second bit line 230 in the outer region B. The first bit line 220 is formed in the cell array region A.

The second self-aligned contact pad 180b may be formed, for example, of polysilicon. As the resistance of polysilicon may be higher than the resistance of metals, the length of the second self-aligned contact pad 180b may be kept as short as possible.

In the semiconductor device test pattern set forth in FIGS. 5-8, the first self-aligned contact pads 180a are discontinuous and are connected through respective first direct contacts 200 to the first bit line 220. The second self-aligned contact pads 180b are formed in both the cell array region A and the outer region B. The second self-aligned contact pads 180b are electrically connected through the second direct contacts 210 to the second bit line 230. The first bit line 220 is electrically connected to the first probing pad 420, and the second bit line 230 is electrically connected to the second probing pad 520.

With this structure, the first probing pad 420 can measure leakage current of the first impurity doped regions 150a as it is electrically connected to the first impurity doped regions 150a through the first bit line 220 and the first self-aligned contact pads 180a. The second probing pad 520 can measure leakage current of the second impurity doped regions 150b via the electrical connection provided by the second bit line 230 and the first self-aligned contact pads 180b. This may make it possible to more precisely measure leakage currents of the cell transistors by measuring the current flowing between the first and second impurity doped regions 150a and 150b.

Figure 9:
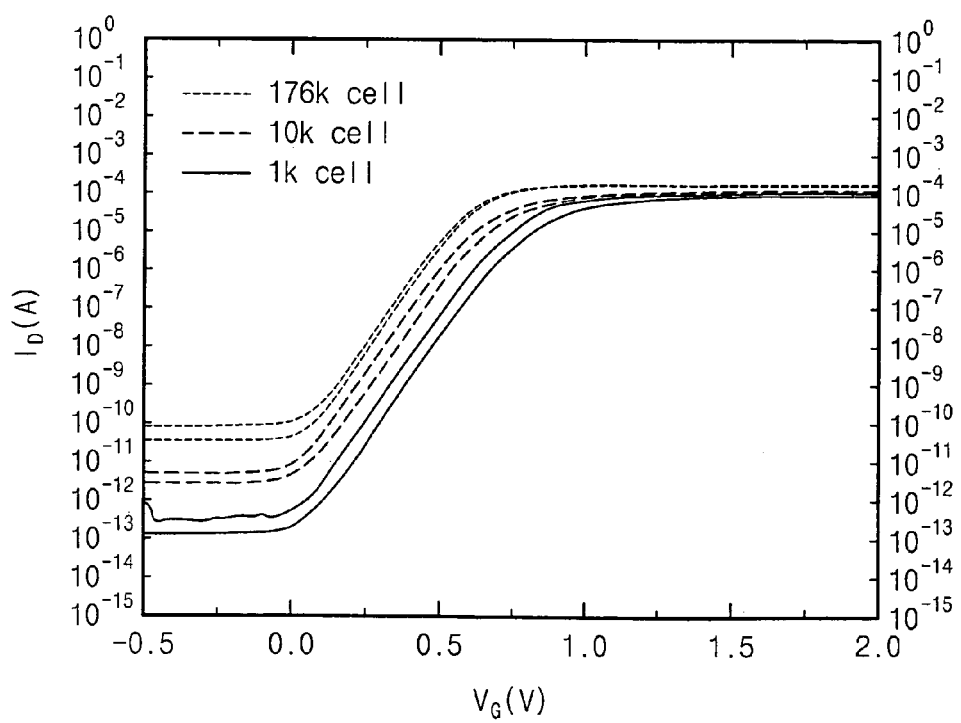
FIG. 9 is a graph illustrating various electrical properties of an exemplary semiconductor device test pattern according to first embodiments of the present invention.

FIG. 9 is a graph illustrating various electrical properties of a semiconductor device test pattern according to the first embodiments of the present invention. As shown in FIG. 9, the on-current characteristic is inadequately reflected due to voltage sag induced by the resistance of the second self-aligned contact pad 180b. As noted above, the second self-aligned contact pad 180b may be formed of polysilicon, which may typically exhibit a higher resistance than does metal.

FIG. 9 further shows that the leakage current increases on the order of a factor of ten with increasing number of cells in the cell array (e.g., 1 k, 10 k, 176 k). Leakage current has an important influence on retention time. FIG. 9 shows that the resistance of a self-aligned contact pad formed of polysilicon may not have an important influence on leakage current. In the graph of FIG. 9, k is a unit representing $10^3$, the horizontal axis reflects the gate voltage $V_g$ in volts and the vertical axis reflects the drain current ID in amperes.

FIGS. 10-14 are cross-sectional views that illustrate methods for forming a semiconductor device test pattern according to the first embodiments of the present invention. In FIGS. 10-14, the designators α, β and X denote cross-sectional views taken along the lines I-I, II-II and III-III of FIG. 5, respectively. The designators A and B denote the cell array region and the outer region, respectively.

As shown in FIG. 10, the semiconductor device test pattern is formed on a semiconductor substrate 100 which, for example, may be a silicon substrate. Active regions 130 are defined in the semiconductor substrate 100 by forming an isolation layer 120 using, for example, a trench isolation process. A plurality of word lines 140 that are elongated in a certain direction are also formed on the semiconductor substrate 100. A first impurity doped region 150a (the first impurity doped region 150a is omitted from the a part of FIG. 6, but is depicted by a dotted line to show the present invention clearly and definitely. The result is the same as described above in FIGS. 11-14.) and a second impurity doped region 150b may be formed through implantation of, for example, boron or phosphorous ions into the semiconductor substrate 100 between the word lines 140.

As shown in FIG. 11, a first interlayer dielectric layer 160 may be formed by, for example, depositing an electrically insulating material such as an oxide using chemical vapor deposition ("CVD") techniques on the semiconductor substrate 100. The first self-aligned contact pad 180a and the second self-aligned contact pad 180b are also formed. As shown by the combination of FIGS. 5 and 11, the first self-aligned contact pads 180a penetrate the first interlayer dielectric layer 160 to electrically connect to the first impurity doped regions 150a, and the second self-aligned contact pad 180b penetrates the first interlayer dielectric layer 160 to electrically connect to the second impurity doped regions 150b. As is also shown in FIG. 11, the first self-aligned contact pads 180a are discontinuous between the word lines 140, while the second self-aligned contact pad 180b may be continuous between the word lines 140.

Figure 12:
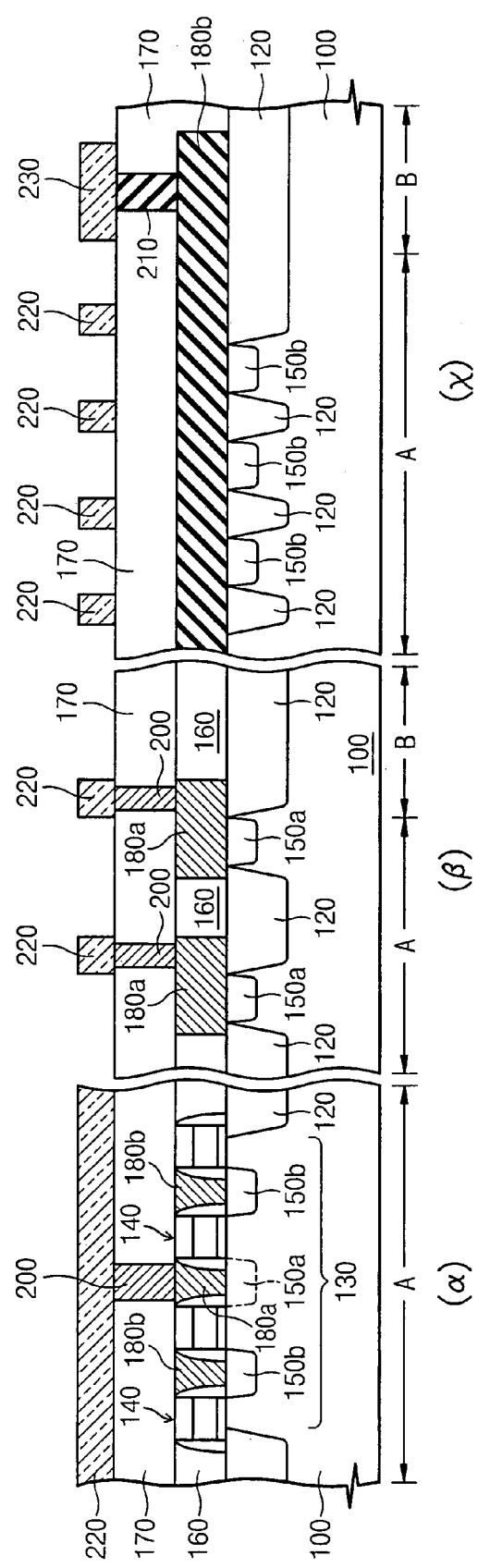

As shown in FIG. 12, a second interlayer dielectric layer 170 may be formed on the first interlayer dielectric layer 160 by, for example, depositing an electrically insulating material such as an oxide using CVD techniques. A first direct contact 200 may be formed that penetrates the second interlayer dielectric layer 170 to electrically connect to the first self-aligned contact pad 180a. The second direct contact 210 may be formed before, after or at the same time as the first direct contacts 200. The second direct contact 210 penetrates the second interlayer dielectric layer 170 to electrically connect to the second self-aligned contact pad 180b. As shown in FIG. 12, the first direct contacts 200 are formed in the cell array region A, and the second direct contact 210 is formed in the outer region B.

Figure 13:
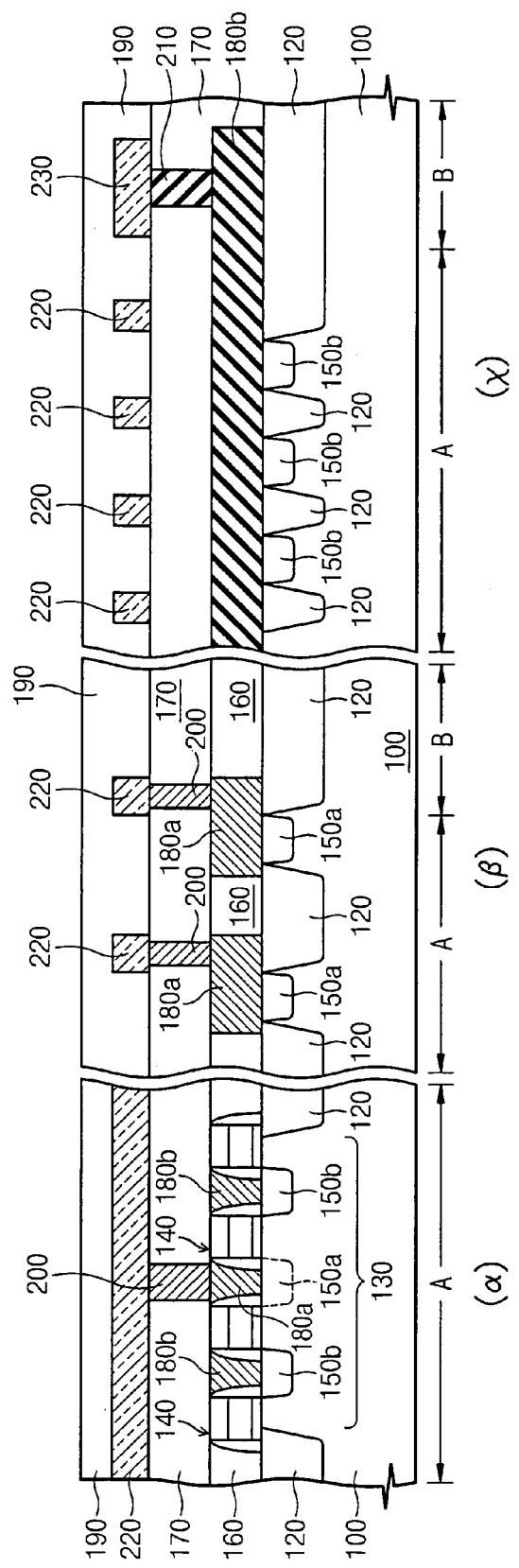

The first bit line 220 is formed on the second interlayer dielectric layer 170 in the cell array region A. The first bit line 220 is electrically connected to the first direct contact 200. The second bit line 230 may be formed at the same time on the second interlayer dielectric layer 170 in the outer region B. The second bit line 230 is electrically connected to the second direct contact 210. As shown in FIG. 13, a third interlayer dielectric layer 190 may be formed on the second interlayer dielectric layer 170 by depositing an electrically insulating material, such as an oxide, using CVD techniques.

Figure 14:
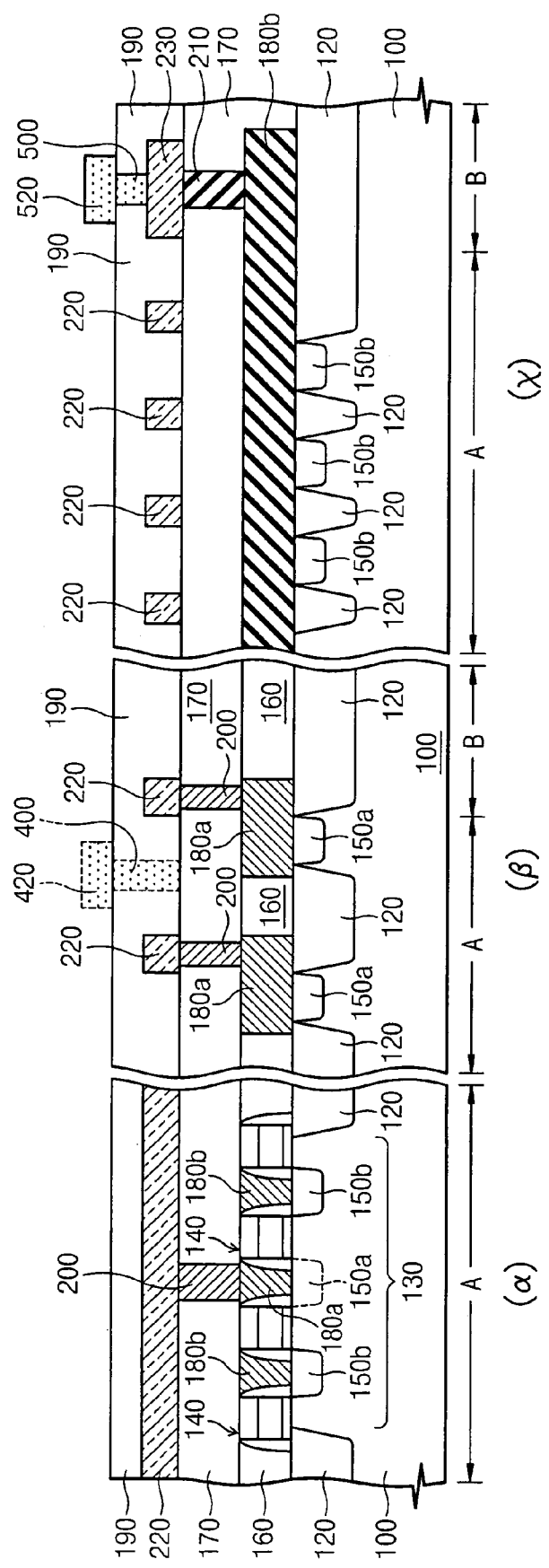

As shown in FIG. 14, a first metal contact 400 may then be formed. The first metal contact 400 penetrates the third interlayer dielectric layer 190 to electrically connect to the first bit line 220. (As shown in FIG. 5, the first metal contact 400 and the first probing pad 420 are formed in the outer region B and shall not be shown in the cross-section of FIG. 14. However, the first metal contact 400 and the first probing pad 420 are depicted as dotted lines to describe the present invention clearly and definitely in the A region of the β part of FIG. 14). A second metal contact 500 may also be formed that penetrates the third interlayer dielectric layer 190 to electrically connect to the second bit line 230. A first probing pad 420 and a second probing pad 520 are then formed on the third interlayer dielectric layer 190. The first probing pad 420 is electrically connected to the first metal contact 400, and the second probing pad 520 is electrically connected to the second metal contact 500. In the embodiment depicted in FIG. 14, the second metal contact 500 is formed in the outer region B to electrically connect to the second self-aligned contact pad 180b. As a result, the second bit line 230 is electrically connected through the second metal contact 500 and the second direct contacts 210 to a plurality of second self-aligned contact pads 180b.

According to process described above, the first self-aligned contact pads 180a are formed as discontinuous contact pads so that they are connected through the first direct contact 200 to the first bit line 220. The second self-aligned contact pad 180b may be formed as a continuous line that extends across the cell array region A into the outer region B. As a result, the second self-aligned contact pad 180b is electrically connected to the second probing pad 520 through the second direct contact 210 and the second bit line 230 in the outer region of cell array B, while the first bit line 220 is electrically connected to the first probing pad 420.

In the above-described structure, the first probing pad 420 can measure leakage current of the first impurity doped regions 150a via the first bit line 220 and the first self-aligned contact pads 180a, while the second probing pad 520 can measure leakage current of the second impurity doped regions 150b via the second bit line 230 and the second self-aligned contact pads 180b. Thus, the above-described test pattern structure according to first embodiments of the present invention may be able to measure leakage currents of the cell transistors with increased precision by measuring the electric current flowing between the first impurity doped regions 150a and the second impurity doped regions 150b.

A semiconductor test pattern according to second embodiments of the present invention will now be described with respect to FIGS. 15-16, which are top plan views of two exemplary test patterns.

Figure 15:
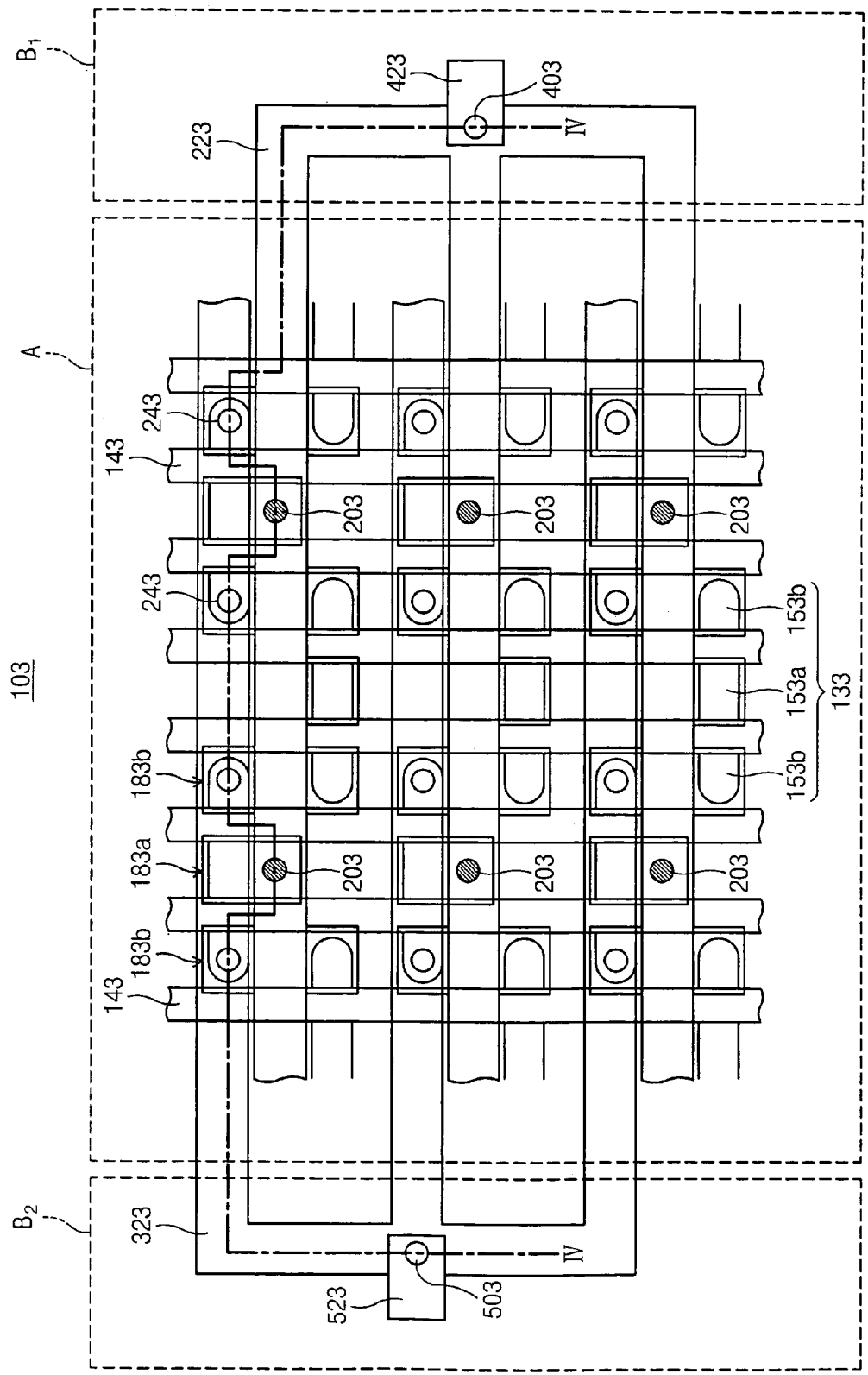
FIG. 15 is a top view of a semiconductor device test pattern according to second embodiments of the present invention.
Figure 16:
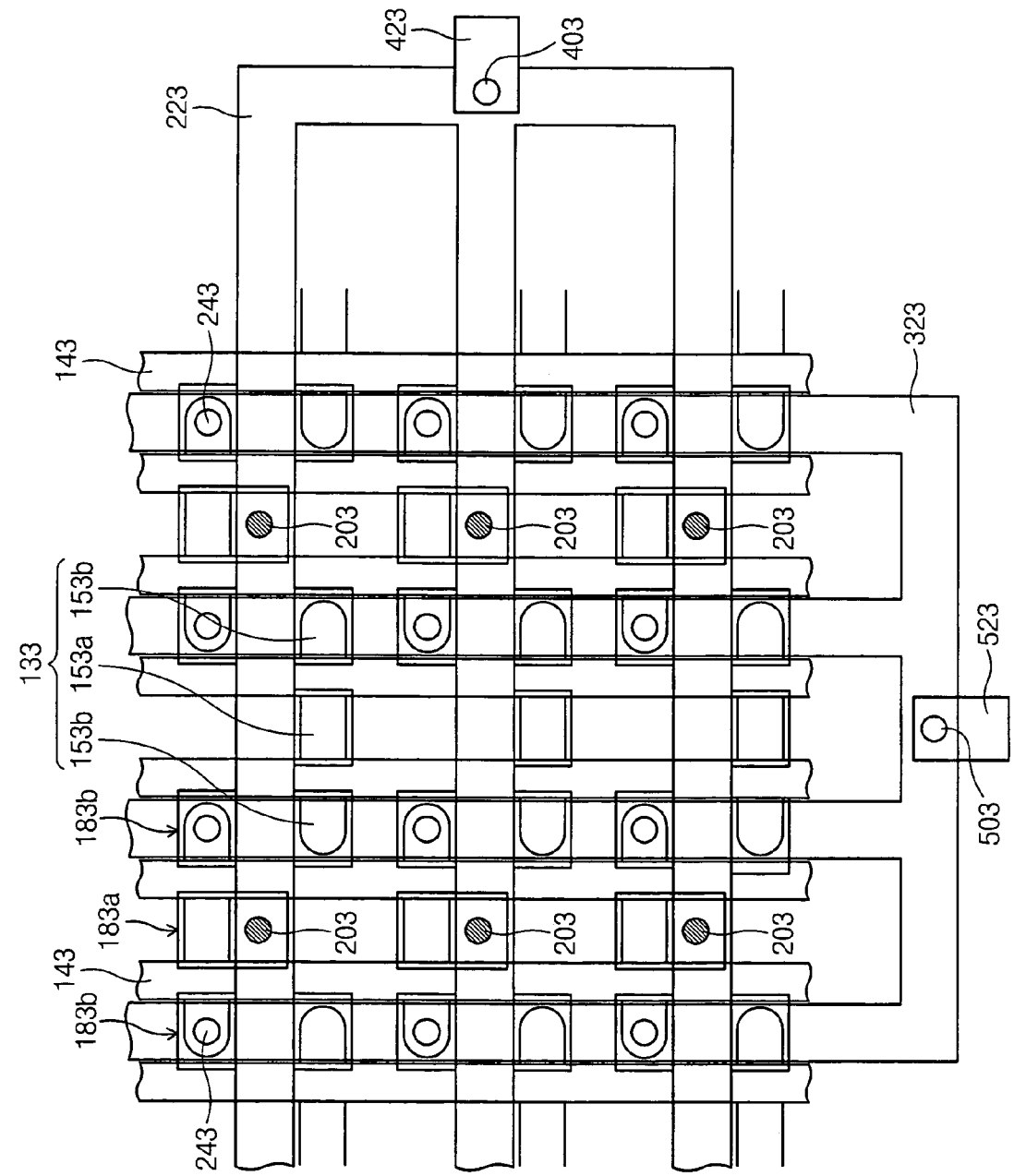
FIG. 16 is a top view of another semiconductor device test pattern according to the second embodiments of the present invention.

As shown in FIG. 15, the semiconductor device test patterns according to second embodiments of the present invention include a semiconductor substrate 103 which may comprise, for example, a silicon substrate. A plurality of parallel word lines 143 are formed on the semiconductor substrate. In the exemplary embodiment depicted in FIG. 15, the word lines 143 run in the vertical direction.

The semiconductor device test pattern of FIG. 15 also includes a first bit line 223 that is electrically connected to a first probing pad 423. The first bit line 223 is arranged at a right angle to the word lines 143. A probing line 323 is electrically connected to a second probing pad 523. The probing line 323 likewise is arranged at a right angle to the word lines 143. The first bit line 223 is electrically connected through a first metal contact 403 to the first probing pad 423 in an outer region $B_1$, and the probing line 323 is electrically connected through a second metal contact 503 to the second probing pad 523 in an outer region $B_2$.

The cell array region A includes a plurality of active regions 133. Each active region 133 includes a first impurity doped region 153a and second impurity doped regions 153b that are formed in the semiconductor substrate 103. The major axis of the active regions 133 may be disposed at right angles to the word lines 143. The first impurity doped region 153a and the second impurity doped region 150b may be doped, for example, with impurities such as phosphorous or boron. The first impurity doped region 153a is electrically connected to the bit line 223, and the second impurity doped region 150b is electrically connected to the probing line 323 that is arranged in a horizontal direction (i.e., parallel to the first bit line 223).

As shown in FIG. 15, the bit line 223 is electrically connected through the first self-aligned contact pads 183a and direct contacts 203 to the first impurity doped regions 153a. The first self-aligned contact pad 183a is connected to the first impurity doped region 153a. The first self-aligned contact pads 183a are aligned between adjacent word lines 143 and isolation regions are formed between adjacent first self-aligned contact pads 183a. The first self-aligned contact pad 180a may, for example, be formed using a conductive material such as polysilicon so that it operates as a conductor. The first self-aligned contact pad 183a is electrically connected through the direct contact 203 to the bit line 223.

The probing line 323 is electrically connected through a second self-aligned contact pads 183b and buried contacts 243 to the second impurity doped regions 153b. The second self-aligned contact pads 183b are electrically connected to respective of the second impurity doped regions 153b and, like the first self-aligned contact pads 183a, are formed in a discontinuous fashion between the word lines 143. The second self-aligned contact pads 183b may be formed, for example, of a conductive material such as impurity doped polysilicon. The second self-aligned contact pads 183b are electrically connected through the buried contacts 243 to the probing line 323. The buried contacts 243 may be contact plugs that are electrically connected to respective storage nodes.

In another approach, the second self-aligned contact pads 183b may be electrically connected to the probing line 323 in the cell array region A. Moreover, the probing line 323 may be arranged at a right angle to the word lines 143 as shown in FIG. 15, or in a parallel direction to the word lines 143 as shown FIG. 16, or in various other configurations.

Figure 17:
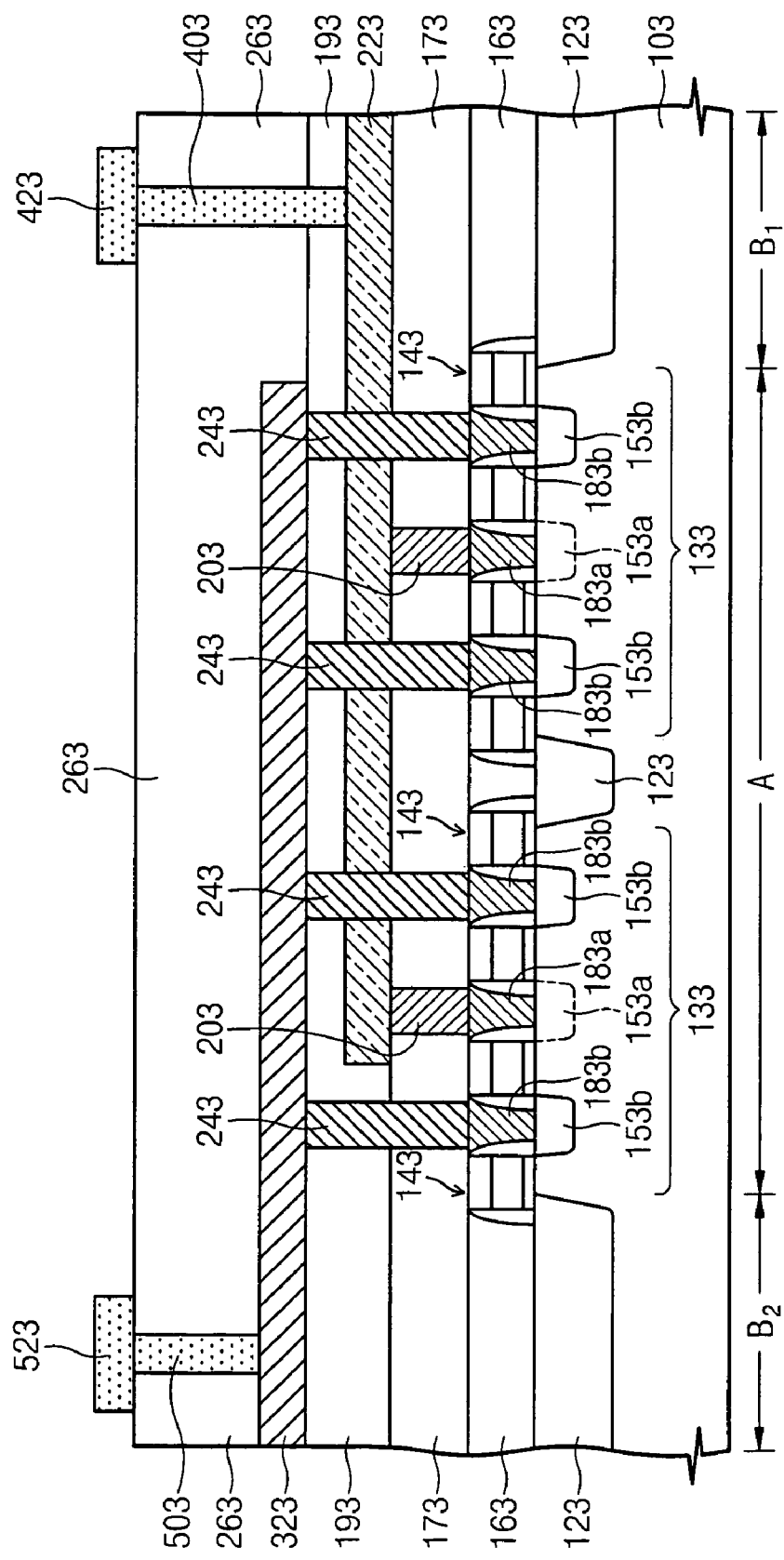
FIG. 17 is a cross-sectional view of the test pattern of FIG. 15 taken along the line IV-IV in FIG. 15.

FIG. 17 is cross-sectional view taken along the line IV-IV in FIG. 15. As shown in FIG. 17, semiconductor device test patterns according to the second embodiments of the present invention may include a plurality of word lines 143 that are formed on a semiconductor substrate 103. A plurality of active regions 133 are defined at the semiconductor substrate 103 by an isolation layer 123. The first self-aligned contact pads 183a and the second self-aligned contact pads 183b are formed between the word lines 143.

Each active region 133 includes a first impurity doped region 153a (the first impurity doped regions 153a shall be omitted from FIG. 17, but are depicted by dotted lines to show the present invention clearly and definitely) and second impurity doped regions 153b, and are is formed on the semiconductor substrate 103 between the word lines 143. The first impurity doped regions 153a are electrically connected to the first self-aligned contact pads 183a, and the second impurity doped regions 153b are electrically connected to the second self-aligned contact pads 183b. The first self-aligned contact pads 183a are electrically connected to the bit line 223 through the first direct contacts 203, and the second self-aligned contact pads 183b are electrically connected to the probing line 323 through the buried contacts 243.

The bit line 223 is electrically connected to the first self-aligned contact pads 183a in the cell array region A through the direct contacts 203. The bit line 223 is electrically connected to the first probing pad 423 in the outer region $B_1$ through the first metal contact 403. The probing line 323 is electrically connected to the second self-aligned contact pads 183b in the cell array region A through the buried contacts 243. The probing line 323 is electrically connected to the second probing pad 523 in the outer region $B_2$ through the second metal contact 503.

The device further includes first, second, third and fourth interlayer dielectric layers 163, 173, 193, 263, respectively. The first, second, third and fourth interlayer dielectric layers 163, 173, 193, 263 electrically insulate various components formed on the semiconductor substrate 103.

As shown in FIG. 17, the bit line 223 is electrically connected through the direct contacts 203 to the first self-aligned contact pads 183a in the cell array region A and through the first metal contact 403 to the first probing pad 423 in the outer region $B_1$. The probing line 323 is electrically connected through the buried contacts 243 to the second self-aligned contact pads 183b in the cell array region A and through the second metal contact 503 to the second probing pad 523 in the outer region $B_2$. The first probing pad 423 can measure leakage current of the first impurity doped regions 153a via the bit line 223 and the first self-aligned contact pads 183a. The second probing pad 523 can likewise measure leakage current of the second impurity doped regions 153b via the probing line 323 and the second self-aligned contact pads 183b.

Methods for forming semiconductor device test patterns according to the second embodiments of the present invention are described below with reference to FIGS. 18-22, which are cross-sectional views illustrating various operations in the fabrication of the test patterns. In FIGS. 18-22, region A indicates the cell array region, $B_1$ indicates a first outer region and $B_2$ indicates a second outer region.

As shown in FIG. 18, a semiconductor substrate 103 such as a silicon semiconductor substrate is prepared. Active regions 133 are defined by forming an isolation layer 123 using, for example, a trench isolation process. A plurality of word lines 143 are formed on the semiconductor substrate 103. The first impurity doped regions 153a (the first impurity doped regions 153a shall be omitted from FIG. 18, but are depicted by dotted lines to describe the present invention clearly and definitely. The same is also true with respect to FIGS. 19-22.) and the second impurity doped regions 153b may then be formed, for example, by implanting boron or phosphorous ions on the semiconductor substrate 103 between the word lines 143. A first interlayer dielectric layer 163 may be formed by depositing an electrically insulating material on the substrate 103 such as, for example, an oxide using, for example, a conventional CVD process.

As shown in the combination of FIGS. 15 and 19, the first self-aligned contact pads 183a are formed such that they penetrate the first interlayer dielectric layer 163 to electrically connect to respective of the first impurity doped regions 153a. Likewise, the second self-aligned contact pads 183b are formed such that they penetrate the first interlayer dielectric layer 163 to electrically connect to respective of the second impurity doped regions 153b.

Figure 20:
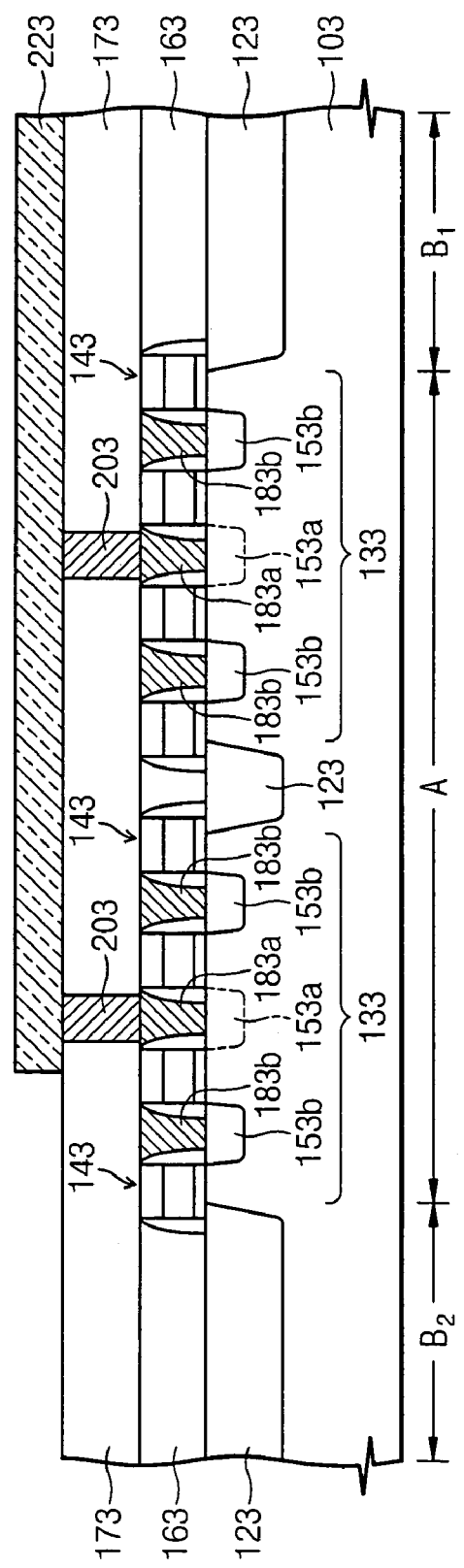

As shown in FIG. 20, the second interlayer dielectric layer 173 may be formed by depositing an electrically insulating material, such as an oxide, using CVD techniques on the first interlayer dielectric layer 163. The direct contacts 203 are formed in the cell array region A to penetrate the second interlayer dielectric layer 173 to electrically connect to the first self-aligned contact pads 183a. The bit line 223 is likewise formed in the cell array region A and the outer region $B_1$ such that it electrically connects to the direct contacts 203. The bit line 223 may be formed at a right angle to the word lines 143.

Figure 21:
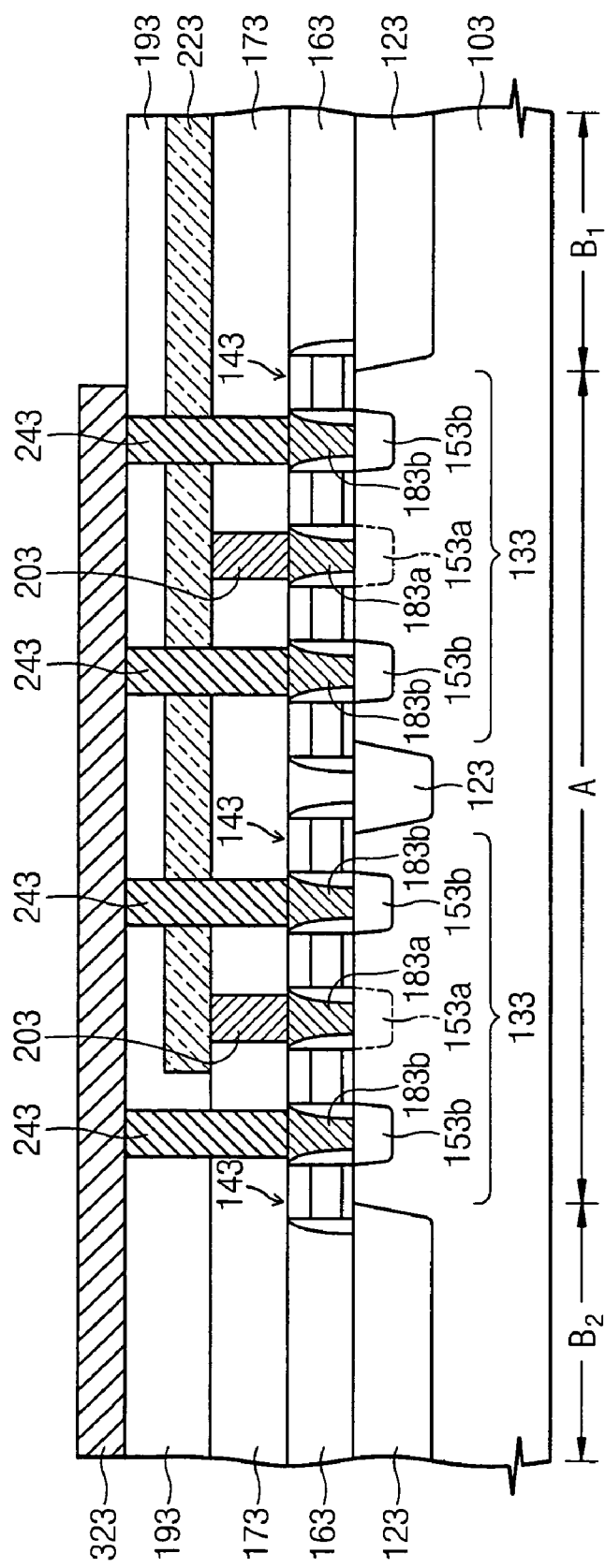

As shown in FIG. 21, the third interlayer dielectric layer 193 may then be formed by depositing an electrically insulating material (e.g., an oxide) on the second interlayer dielectric layer 173 using CVD techniques. The buried contacts 243 are formed in the cell array region A to penetrate the second and third interlayer dielectric layers 173 and 193 to electrically connect to the second self-aligned contact pads 183b.

The probing line 323 is formed on the third interlayer dielectric layer 193 such that it electrically connects to the buried contacts 243. The probing line 323 may also be formed at a right angle to the word lines 143.

Figure 22:
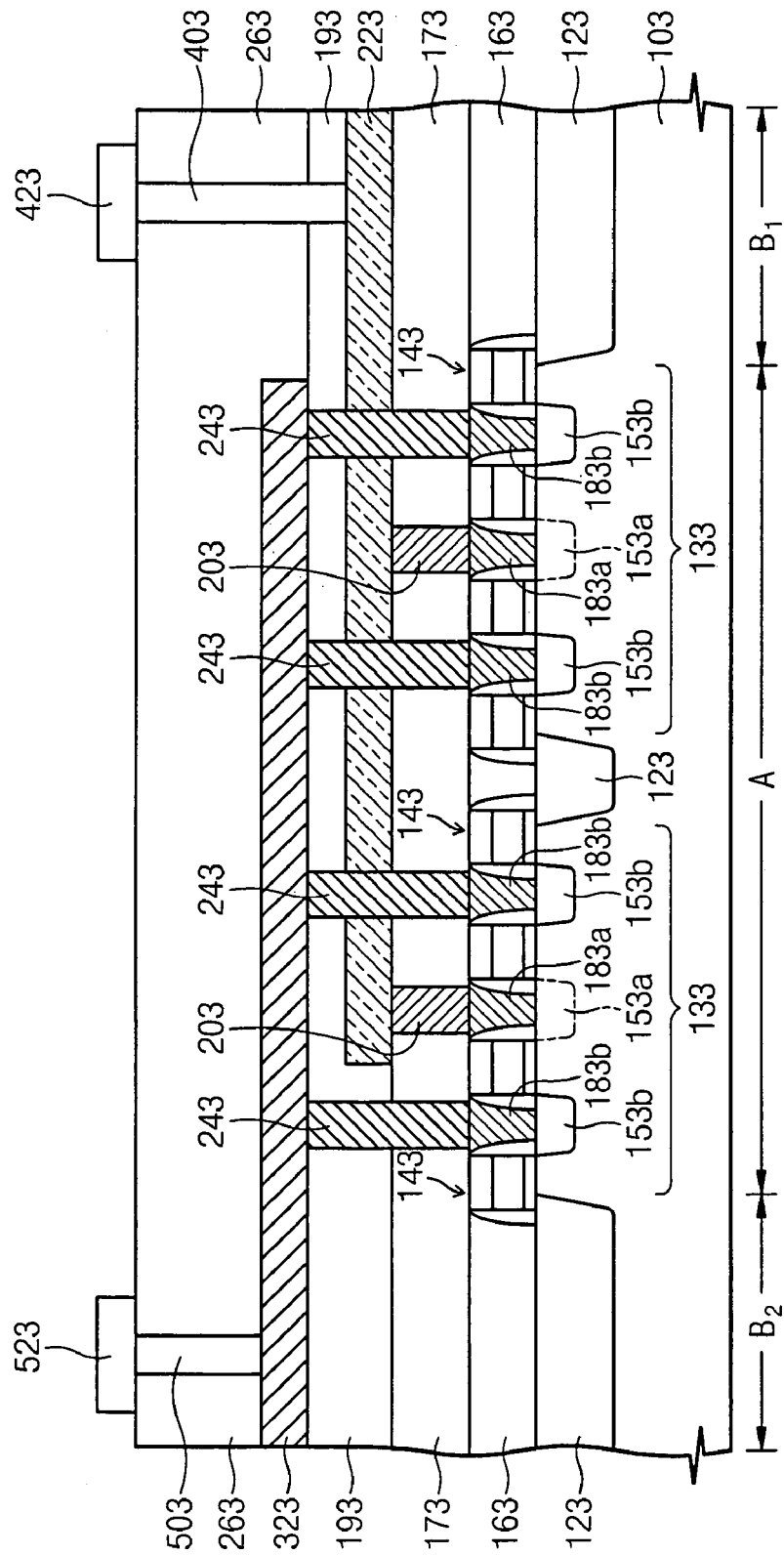

As shown in FIG. 22, a fourth interlayer dielectric layer 263 may be formed by depositing an electrically insulating layer, such as an oxide layer, on the third interlayer dielectric layer 193. The first metal contact 403 is formed in the outer region $B_1$ such that it penetrates the third and fourth interlayer dielectric layers 193 and 263 to electrically connect to the bit line 223. The second metal contact 503 may be formed in the same step in the outer region $B_2$. As shown in FIG. 22, the second metal contact 503 penetrates the fourth interlayer dielectric layer to electrically connect to the probing line 323.

Next, the first probing pad 423 may be formed on the fourth interlayer dielectric layer 263 in the outer region $B_1$ so that it electrically connects to the first metal contact 403. The second probing pad 523 is formed on the fourth interlayer dielectric layer 263 in the outer region $B_2$ to electrically connect to the second metal contact 503.

Through the fabrication process described above, the bit line 223 is electrically connected, via the direct contacts 203, to the first self-aligned contact pads 183a in the cell array region A and, via the first metal contact 403, to the first probing pad 423 in the outer region $B_1$. The probing line 323 is electrically connected through the buried contacts 203 to the second self-aligned contact pads 183b in the cell array region A and through the second metal contact 503 to the probing pad 523 in the outer region $B_2$.

Pursuant to the semiconductor device test patterns according to the second embodiments of the present invention, the first probing pad 423 can measure leakage current of the first impurity doped regions 153a via the bit line 223 and the first self-aligned contact pads 183a, while the second probing pad 523 can measure leakage current of the second impurity doped regions 153b via the probing line 323 and the second self-aligned contact pads 183b. Thus, leakage current of the cell transistor may be measured with some degree of precision by measuring the electric current passing between the first impurity doped regions 153a and the second impurity doped regions 153b.

Figure 23:
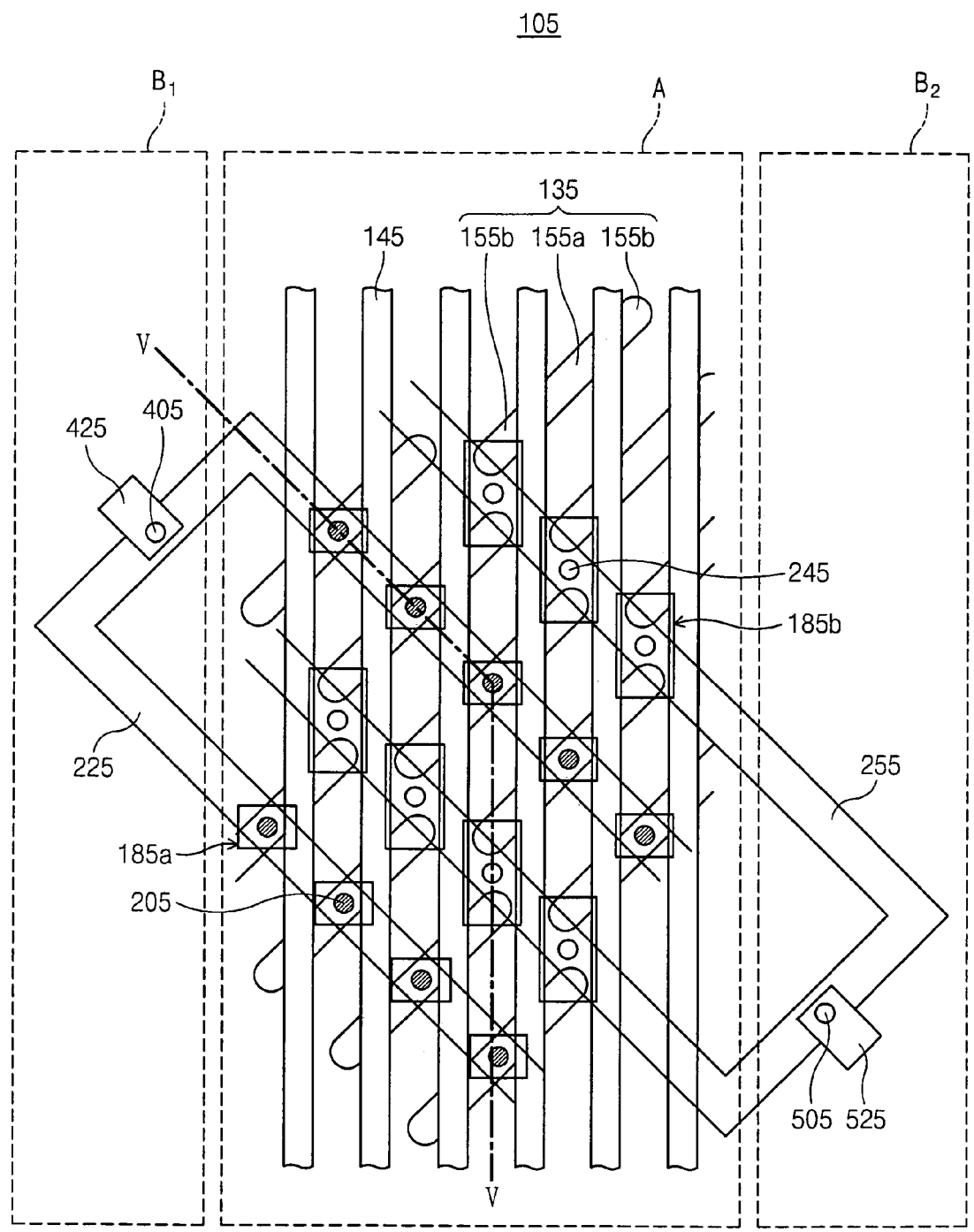
FIG. 23 is a cross-sectional view of a semiconductor device test pattern according to third embodiments of the present invention.
Figure 24:
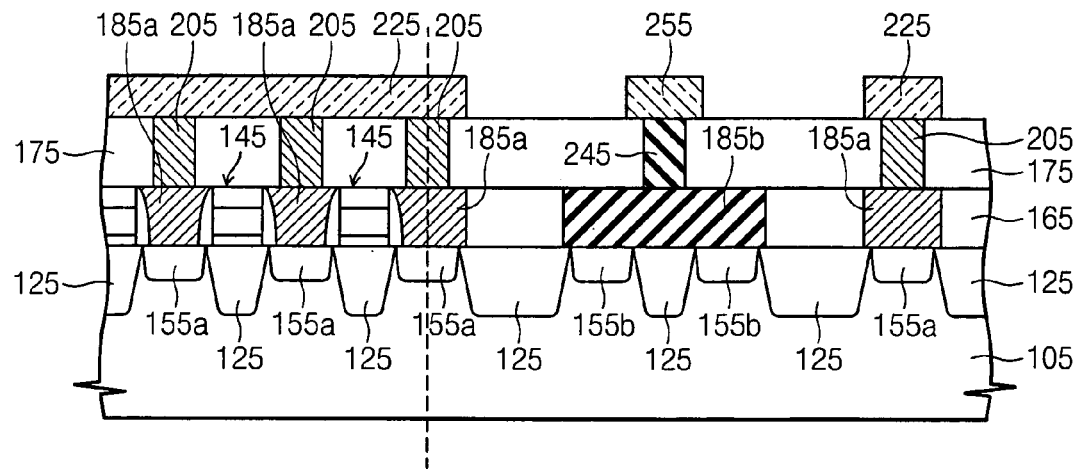
FIG. 24 is a cross-sectional view of the test pattern of FIG. 23 taken along the line V-V in FIG. 23.

FIGS. 23-24 illustrate semiconductor device test patterns according to third embodiments of the present invention.

As shown in FIG. 23, the semiconductor device test pattern includes a semiconductor substrate 105 which, for example, may be a silicon semiconductor substrate. A plurality of word lines 145 are arranged in parallel on the semiconductor substrate 105.

A plurality of active regions 135 that each include a first impurity doped region 155a and second impurity doped regions 155b are formed at the semiconductor substrate 105. The active regions 135 are formed at an oblique angle with respect to the word lines 145. For example, the active regions 135 may be formed at a 45 degree angle to the word lines 145. The first impurity doped regions 155a and the second impurity doped regions 155b may be doped with impurities such as phosphorous or boron.

A first bit line 225 is electrically connected to a first probing pad 425 and is arranged at a right angle to the elongated axis of the active regions 135. A second bit line 255 is electrically connected to a second probing pad 525 and is parallel to the first bit line 225. The second bit line 255, as described later, may be electrically connected to each of a plurality of second self-aligned contact pads 185b in the cell array region A.

The first impurity doped regions 155a are electrically connected to the first bit line 225 in the cell array region A, and the second impurity doped regions 155b are electrically connected to the second bit line 255 in the cell array region A.

The first bit line 225 is connected through the first self-aligned contact pads 185a and the first direct contacts 205 to the first impurity regions 155a. Specifically, the first self-aligned contact pads 185a may be formed on respective of the first impurity doped regions 155a, and a plurality of isolation regions may be formed between the word lines 145. The first self-aligned contact pads 185a may be formed of a conductive material such as impurity doped polysilicon so that they operate as conductors. The first self-aligned contact pads 185a are also electrically connected, through the first direct contacts 205, to the first bit line 225. The first bit line 225 may be electrically connected through the first metal contact 405 to the first probing pad 425 in an outer region $B_1$.

The second bit line 255 is electrically connected through the second self-aligned contact pads 185b and the second direct contacts 245 to the second impurity regions 155b. Specifically, the second self-aligned contact pads 185b are electrically connected to respective of the second impurity regions 155b and formed in a discontinuous state between the word lines 145. As shown in FIG. 23, the second self-aligned contact pads 185b are electrically connected to one of the second impurity doped regions 155b in a first active region 135, as well as to one of the second impurity doped regions 155b in a neighboring active region 135. The self-aligned contact pads 185b may be formed of a conductive material such as impurity doped polysilicon so that they operate as conductors. The second self-aligned contact pads 185b may be electrically connected to the second bit line 255 through the second direct contacts 245. The second direct contacts 245 may be a kind of contact plug that are electrically connected to storage nodes. The second bit line 255 may be electrically connected through a second metal contact 505 to the second probing pad 525 in an outer region $B_2$.

As shown in FIG. 23, the first self-aligned contact pads 185a and the second self-aligned contact pads 185b are deposited alternatively between each adjacent pair of word lines 145.

FIG. 24 is a cross-sectional view taken along the line V-V in FIG. 23. In FIG. 24 (as well as FIGS. 25-29 discussed herein), the vertical dotted line identifies the location of the bend in line V-V in FIG. 23.

As shown in FIG. 24, the semiconductor device test pattern includes first and second self-aligned contact pads 185a and 185b that are formed between a plurality of word lines 145 formed on the semiconductor substrate 105. A plurality of active regions 135 (see FIG. 23) are defined in the semiconductor substrate 105 by the isolation layer 125. The active regions 135 include the first and second impurity regions 155a and 155b. The first impurity doped regions 155a are electrically connected to respective of the first self-aligned contact pads 185a, and the second impurity doped regions 155b are electrically connected to respective of the second self-aligned contact pads 185b. In the cell array region A, the first self-aligned contact pads 185a are electrically connected through the first direct contacts 205 to the first bit line 225, and the second self-aligned contact pads 185b are electrically connected through the second direct contacts 245 to the second bit line 255. The device further includes a first interlayer dielectric layer 165 and a second interlayer dielectric layer 175 that electrically insulate various components of the test pattern from each other.

As shown in FIG. 24, the first bit line 225 is electrically connected through the first direct contacts 205 to the first self-aligned contact pads 185a in the cell array region A. As shown in FIG. 23, the first bit line 225 is electrically connected through the first metal contact 405 to the first probing pad 425 in the outer region $B_1$. The second bit line 255 is electrically connected through the second direct contacts 245 to the second self-aligned contact pads 185b (see FIG. 24) and through the second metal contact 505 to the second probing pad 525 in the outer region $B_2$ (see FIG. 23).

As a result, the first probing pad 425 can measure leakage currents of the first impurity doped regions 155a via the first bit line 225 and the first self-aligned contact pads 185a. The second probing pad 525 can likewise measure leakage current of the second impurity doped regions 155b via the second bit line 255 and the second self-aligned contact pads 185b.

A method of fabricating the semiconductor device test pattern of FIGS. 23-24 is described below with reference to FIGS. 25-29, which are cross-sectional views taken along the line V-V in FIG. 23.

Figure 25:
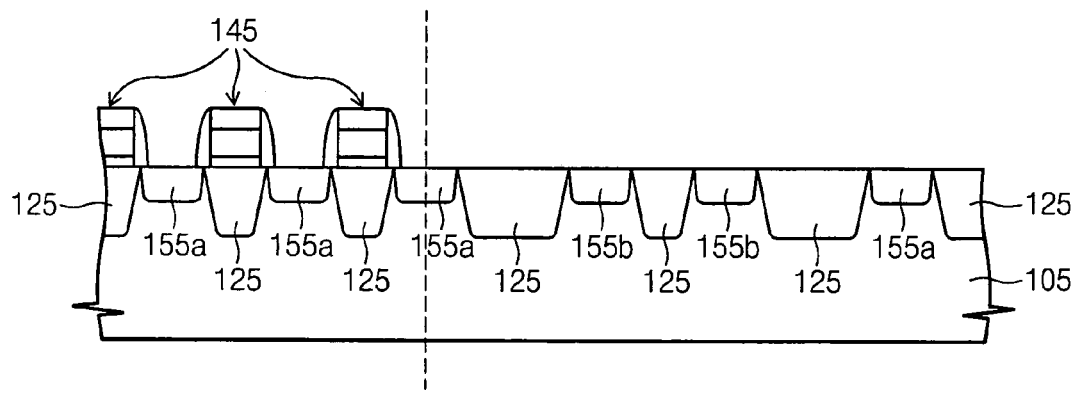
FIGS. 25-29 are cross-sectional views that illustrate methods for fabricating the semiconductor device test pattern of FIG. 23.

As shown in FIG. 25, the semiconductor substrate 105 which may, for example, comprise a silicon substrate, is prepared. A plurality of active regions 135 are defined by forming the isolation layer 125 using, for example, a trench isolation process. A plurality of word lines 145 are formed on the semiconductor substrate 105, and first and second impurity doped regions 155a and 155b are formed in the semiconductor substrate 105 by, for example, implanting boron or phosphorous ions. Moreover, as shown in FIG. 23, when forming the first and second impurity doped regions 155a and 155b, the major axis of the active regions 135 are elongated at an oblique angle with respect to the word lines 145.

Figure 26:
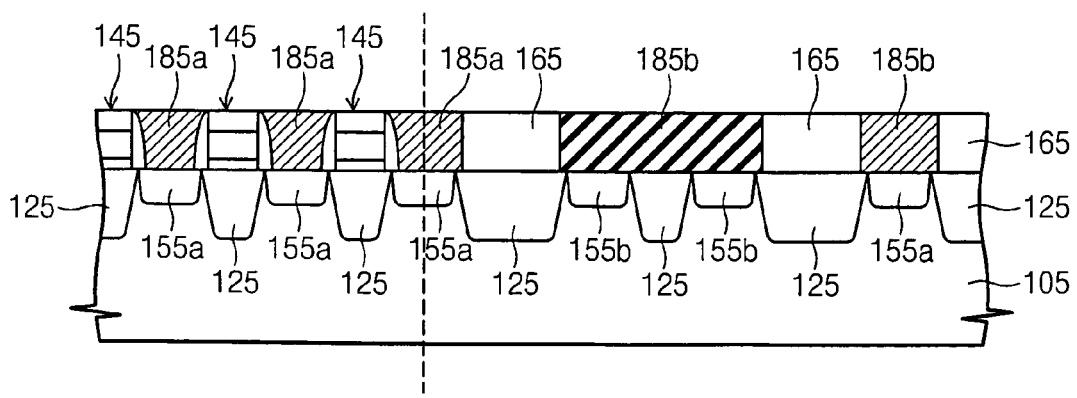

As shown in FIG. 26, the first interlayer dielectric layer 165 may be formed by depositing an electrically insulating material on the semiconductor substrate 105 such as, for example, an oxide, using conventional CVD techniques. The first self-aligned contact pads 185a are formed to penetrate the first interlayer dielectric layer 165 to electrically connect to the first impurity doped region 155a. The second self-aligned contact pads 185b are likewise formed to penetrate the first interlayer dielectric layer to electrically connect to the second impurity doped regions 155b. The first and second self-aligned contact pads 185a and 185b are formed between the word lines 145 in a discontinuous state. Additionally, the first and second self-aligned contact pads 185a and 185b are alternatively disposed between the word lines 145 (see FIG. 23). As is shown in FIG. 23, each second self-aligned contact pad 185b may be electrically connected to a second impurity doped region 155b of a first active area 135 as well as to the second impurity doped region 155b of a second active area 135 that neighbors the first active area 135.

Figure 27:
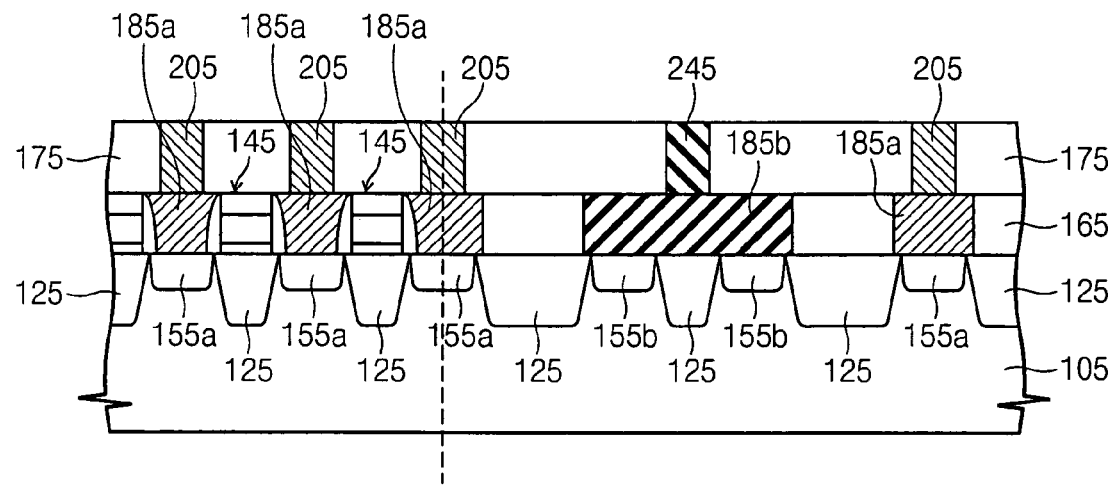

As shown in FIG. 27, the second interlayer dielectric layer 175 may then be formed by, for example, depositing an electrically insulating material such as an oxide using CVD techniques. The first direct contacts 205 are formed to penetrate the second interlayer dielectric layer 175 to electrically connect to the first self-aligned contact pads 185a, and the second direct contacts 245 are formed to penetrate the second interlayer dielectric layer to electrically connect to the second self-aligned contact pads 185b.

The first self-aligned contact pads 185a and the second self-aligned contact pads 185b are alternatively disposed between each pair of adjacent word lines 145. Therefore, the first direct contacts 205 and the second direct contacts 245, which are electrically connected to respective of the first self-aligned contact pads 185a and respective of the second self-aligned contact pads 185b, are also alternatively disposed between each pair of adjacent word lines 145 (see FIG. 23).

Figure 28:
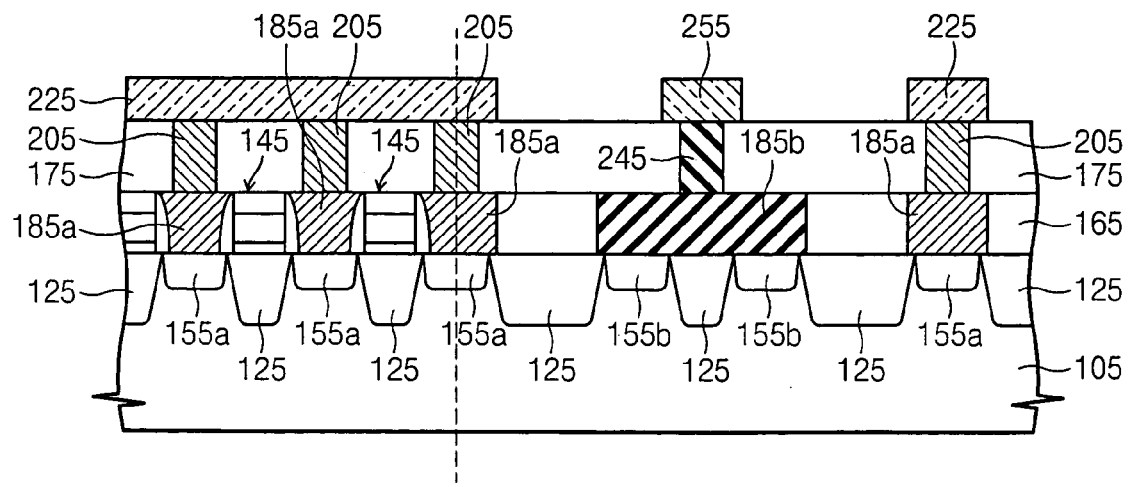

As shown FIG. 28, the first bit line 225 is formed on the second interlayer dielectric layer 175 to electrically connect to the first direct contacts 205, and the second bit line 255 is formed on the second interlayer dielectric layer 175 to electrically connect to the second direct contacts 245.

As shown best in FIG. 23, the first bit line 225 and the second bit line 255 are at right angles to the major axis of the active regions 135. Additionally, the first bit line 225 and the second bit line 255 are alternatively arranged. Accordingly, the first bit line 225 is electrically connected at right angles to all first self-aligned contact pads 185a in the cell array region A, and the second bit line 255 is electrically connected to all second self-aligned contact pads 185b in the cell array region A in the same manner.

Figure 29:
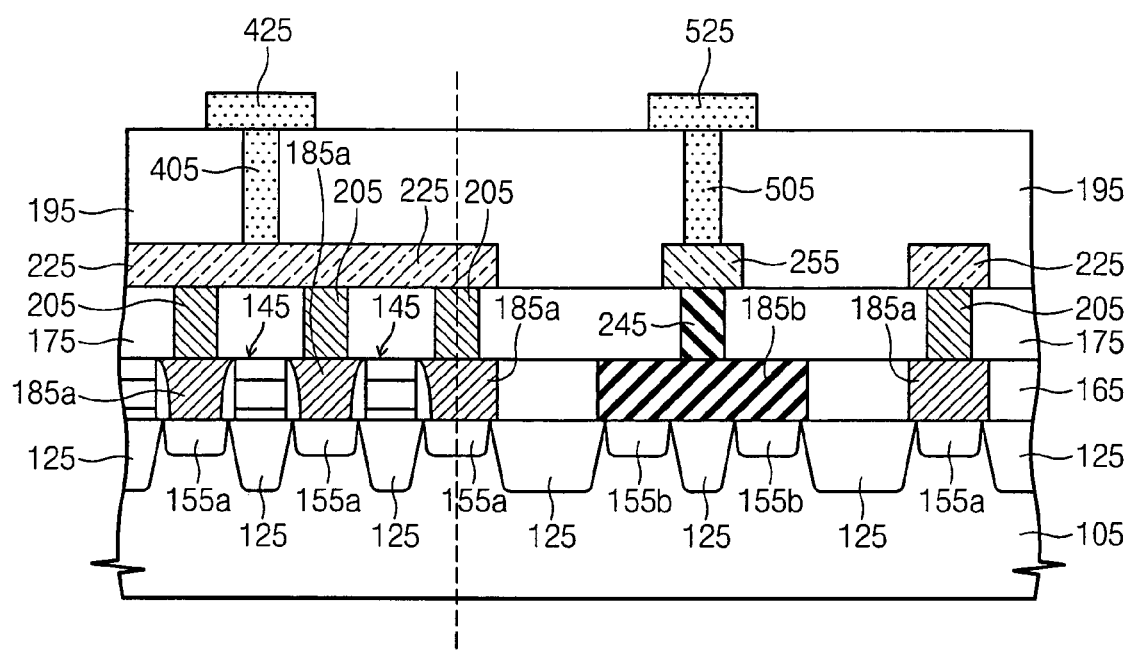

As shown in FIG. 29, a third interlayer dielectric layer 195 may be formed by depositing an electrically insulating material, such as an oxide, using CVD techniques. Then, the first metal contact 405 is formed in the outer region $B_1$ to penetrate the third interlayer dielectric layer 195 and electrically connect to the first bit line 225, and the second metal contact 505 is formed in the outer region $B_2$ to penetrate the third interlayer dielectric layer 195 and electrically connect to the second bit line 255.

The first probing pad 425 and the second probing pad 525 are formed on the third interlayer dielectric layer 195 such that the first probing pad 425 electrically connects to the first metal contact 405 and the second probing pad 525 electrically connects to the second metal contact 505.

According to the process described above, the first bit line 225 is electrically connected through the first direct contacts 205 to the first self-aligned contact pads 185a in the cell array region A and though the first metal contact 405 to the first probing pad 425 in the outer region $B_1$. The second bit line 255 is electrically connected through the second direct contacts 245 to the second self-aligned contact pads 185b in the cell array region A and through the second metal contact 505 to the second probing pad 525 in the outer region $B_2$.

As a result, the first probing pad 425 can measure leakage current of the first impurity doped regions 155a via the first bit line 225 and the first self-aligned contact pads 185a. The second probing pad 525 can measure leakage current of the second impurity doped regions 155b via the second bit line 255 and the second self-aligned contact pads 185b. This may allow for relatively precise measurement of the leakage current of the cell transistor. As such, the retention time of the semiconductor device may be improved. Additionally, a short-circuit effect does not arise between the second direct contacts 245 and the first direct contacts 205 because the distance between the contacts is sufficiently far.

In contrast, as noted above, prior art test patterns have generally formed an interconnection that connects to a buried contact. As such, the electric current flowing between (1) an impurity doped region that is electrically connected to the buried contact and (2) the impurity doped region that is electrically connected to the direct contact cannot be measured. Therefore, the leakage current of the cell transistor cannot be measured exactly because punch-through and the like cannot be measured.

While herein, references are made to probing pads, it will be appreciated by those of skill in the art that the probing pads of embodiments of the present invention need not necessarily have a planar form, but may also comprise wires or three-dimensionally shaped pads.

While the present invention has been described with respect to exemplary embodiments thereof, it should be understood that the embodiments do not limit the scope of the invention. The spirit and the scope of the present invention are to be limited only by the appended claims.

What is claimed is:

1. A semiconductor device, comprising:
   (a) a test pattern that includes
      a word line on a semiconductor substrate;
      an active region comprising a first impurity doped region and a second impurity doped region;
      a first contact pad electrically connected to the first impurity doped region, the first contact pad having a first region that covers the first impurity doped region and a second region that is offset from the first impurity doped region;
      a first bit line electrically connected to the first contact pad;
      a second contact pad electrically connected to the second impurity doped region;
      a second conductive line electrically connected to the second contact pad;
   (b) a first probing pad electrically connected to the first bit line;
   (c) a second probing pad electrically connected to the second conductive line; and
   (d) a first contact plug between the first bit line and the first probing pad that electrically connects the first bit line and the first probing pad.

2. The semiconductor device of claim 1, further comprising:
   a second contact plug that penetrates a first insulation layer between the first contact pad and the first bit line, the second contact plug electrically connecting the first contact pad to the first bit line; and
   a third contact plug that penetrates the first insulation layer, the third contact plug electrically connecting the second contact pad to the second conductive line.

3. The semiconductor device of claim 1, wherein the first contact pad is one of a plurality of discrete first contact pads disposed between the word line and a second word line.

4. The semiconductor device of claim 3, further comprising an insulating pattern that electrically insulates each of the plurality of the discrete first contact pads from one another.

5. The semiconductor device of claim 1, wherein the second impurity doped region is one of a plurality of second doped impurity regions disposed between the word line and a second word line, and wherein the second contact pad extends in a continuous line between the word line and the second word line to electrically connect to the plurality of second impurity doped regions.

6. The semiconductor device of claim 1, wherein the first bit line is perpendicular to a major axis of the active region.

7. The semiconductor device of claim 1, wherein the second conductive line is perpendicular to the word line.

8. The semiconductor device of claim 2, wherein the third contact plug is a buried contact.

9. The semiconductor device of claim 1, wherein a major axis of the active region is at an oblique angle with respect to the word line.

10. The semiconductor device of claim 1, wherein the second conductive line is parallel to the word line.

11. The semiconductor device of claim 1, wherein the first bit line and the second conductive line have a plurality of arms, and wherein one of the arms of the first bit line is disposed between each adjacent set of arms of the second conductive line.

12. The semiconductor device of claim 1, wherein the second contact pad is one of a plurality of discrete second contact pads disposed between the word line and a second word line.

13. The semiconductor device of claim 12, wherein the second impurity doped region is one of a plurality of discrete second impurity doped regions disposed between the word line and the second word line, and wherein each of the second contact pads electrically connects to two of the discrete second impurity doped regions.

14. The semiconductor device of claim 3, wherein the second contact pad is one of a plurality of discrete second contact pads disposed between the word line and a second word line, and wherein the one of the plurality of second contact pads is disposed between adjacent of the first contact pads.

15. The semiconductor device of claim 1, wherein the first bit line is laterally offset from the first and second impurity doped regions.

16. The semiconductor device of claim 1, further comprising an insulating layer between the first bit line and the first probing pad, wherein the first contact plug penetrates the insulating layer.

17. The semiconductor device of claim 1, wherein the first bit line is over the second region of the first contact pad.

18. A semiconductor device, comprising:
 (a) a test pattern that includes
  a word line on a semiconductor substrate;
  an active region comprising a first impurity doped region and a second impurity doped region;
  a first contact pad electrically connected to the first impurity doped region, the first contact pad having a first region that covers the first impurity doped region and a second region that is offset from the first impurity doped region;
  a first bit line electrically connected to the first contact pad;
  a second contact pad electrically connected to the second impurity doped region;
  a second conductive line electrically connected to the second contact pad;
 (b) a first probing pad electrically connected to the first bit line;
 (c) a second probing pad electrically connected to the second conductive line; and
 (d) a first contact plug between the second conductive line and the second probing pad that electrically connects the second conductive line and the second probing pad.

19. The semiconductor device of claim 18, further comprising an insulating layer between the second conductive line and the second probing pad, wherein the first contact plug penetrates the insulating layer.

* * * * *